(12) United States Patent
Jeon

(10) Patent No.: US 12,721,232 B2
(45) Date of Patent: Aug. 25, 2026

(54) SEMICONDUCTOR PACKAGE HAVING MEMORY DEVICES STACKED IN STAIRCASE

(71) Applicant: SK hynix Inc., Gyeonggi-do (KR)

(72) Inventor: Byung Deuk Jeon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 269 days.

(21) Appl. No.: 18/506,141

(22) Filed: Nov. 10, 2023

(65) Prior Publication Data

US 2025/0015051 A1 Jan. 9, 2025

(30) Foreign Application Priority Data

Jul. 5, 2023 (KR) ........................ 10-2023-0086942

(51) Int. Cl.
*H10W 90/00* (2026.01)
*H10B 80/00* (2026.01)
(Continued)

(52) U.S. Cl.
CPC ............ *H10W 90/00* (2026.01); *H10B 80/00* (2023.02); *H10W 90/752* (2026.01);
(Continued)

(58) Field of Classification Search
CPC ....... H01L 25/0657; H01L 2225/06562; H01L 2225/06506; H01L 2225/06503; H01L 2225/0651; H01L 2225/06555; H01L 2224/48145; H01L 2224/48227; H01L 2224/04042; H01L 2224/32145; H01L 2224/48091; H01L 2224/05554; H01L 2224/05553; H01L 2224/0555; H01L 24/49; H01L 25/18; H10B 80/00;
(Continued)

(56) References Cited

U.S. PATENT DOCUMENTS 11,081,468 B2 8/2021 Fujisawa et al.
2011/0024743 A1* 2/2011 Lee ...................... H10W 90/00
257/E23.141

(Continued)

FOREIGN PATENT DOCUMENTS

KR 10-1831692 B1 2/2018
KR 10-2021-0103307 A 8/2021

*Primary Examiner* — Jose R Diaz
(74) *Attorney, Agent, or Firm* — IP&T GROUP LLP

(57) ABSTRACT

A semiconductor package includes a substrate having bond fingers; a master memory chip mounted on the substrate; and a slave memory chip stacked over the master memory chip. The master memory chip includes master external pads and master internal pads disposed adjacent to a first side edge of the master memory chip; and master power pads disposed adjacent to a second side edge of the master memory chip. The slave memory chip includes slave external pads and slave internal pads disposed adjacent to a first side edge of the slave memory chip; and slave power pads disposed adjacent to a second side edge of the slave memory chip. A portion of the bond fingers is electrically connected to the master external pads through external bonding wires. The master internal pads are electrically connected to the slave internal pads through internal bonding wires, respectively, and the slave external pads are floated.

20 Claims, 20 Drawing Sheets

(51) Int. Cl.
*H10W 72/50* (2026.01)
*H10W 72/90* (2026.01)
*H10W 90/24* (2026.01)

(52) U.S. Cl.
CPC .... *H10W 72/5445* (2026.01); *H10W 72/5473* (2026.01); *H10W 72/932* (2026.01); *H10W 72/9445* (2026.01); *H10W 72/952* (2026.01); *H10W 90/24* (2026.01); *H10W 90/754* (2026.01)

(58) Field of Classification Search
CPC ............... H10W 90/00; H10W 20/484; H10W 72/5473; H10W 72/50
See application file for complete search history.

(56) References Cited

U.S. PATENT DOCUMENTS

| | | | | |
|---|---|---|---|---|
| 2018/0040589 | A1* | 2/2018 | Huang | H10W 90/00 |
| 2019/0237431 | A1* | 8/2019 | Kim | H01L 23/3135 |
| 2021/0065803 | A1* | 3/2021 | Lee | G11C 16/06 |
| 2025/0365989 | A1* | 11/2025 | Kang | H10B 80/00 |

* cited by examiner

Figure 3C:
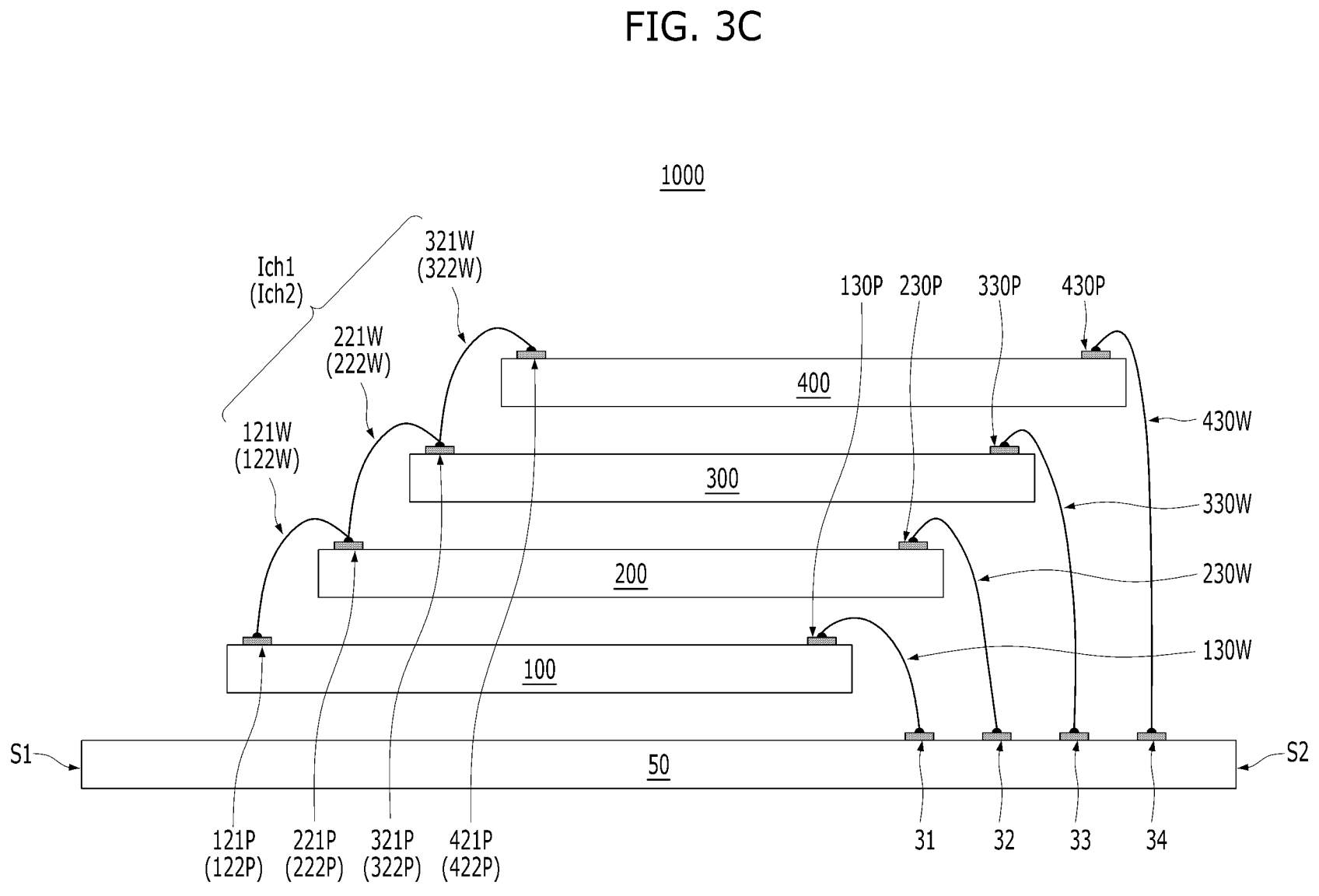

430W
330W
230W
130W
S2
34
33
32
31
430P
330P
230P
130P
400
300
200
100
50
421P (422P)
321P (322P)
221P (222P)
121P (122P)
321W (322W)
221W (222W)
121W (122W)
Ich1 (Ich2)
S1

FIG. 4B 100
121W
122W
Ich1
Ich2
111W
112W
111P
112P
121P
122P
130P
130W
Ech1
Ech2
PCm
CBm
151
152
161
162

Ech1
Ech2

FIG. 8A 1000A
400A
300A
200A
100A
50
S1
S2
10
31
32
33
34
110P
120P
130P
210P
220P
230P
310P
320P
330P
410P
420P
430P
110W
120W
130W
140W
230W
330W
430W
Ich

SEMICONDUCTOR PACKAGE HAVING MEMORY DEVICES STACKED IN STAIRCASE

CROSS-REFERENCE TO RELATED APPLICATION

The present application claims priority under 35 U.S.C 119(a) to Korean Patent Application No. 10-2023-0086942, filed on Jul. 5, 2023, which is incorporated herein by reference in its entirety.

BACKGROUND

1. Field

Embodiments of the present disclosure relate to a semiconductor package including memory chips that are stacked in a staircase shape including pads and bonding wires separately disposed according to functions and channels.

2. Description of the Related Art

A semiconductor package including a plurality of memory chips that are stacked in a staircase shape for high capacity and high-speed operation is proposed.

SUMMARY

Embodiments of the present disclosure provide a semiconductor package including a plurality of memory chips that are stacked in three-dimensional (3D) offset.

Embodiments of the present disclosure provide a semiconductor package including a plurality of memory chips that are stacked in 3D offset using bonding wires.

Embodiments of the present disclosure provide a semiconductor package including a plurality of memory chips that are stacked in 3D offset having pads and bonding wires separately disposed according to functions.

In accordance with an embodiment of the present disclosure, a semiconductor package includes: a substrate having a plurality of bond fingers; a master memory chip mounted on the substrate; and a slave memory chip stacked over the master memory chip. The master memory chip includes master external pads and master internal pads disposed adjacent to a first side edge of the master memory chip; and master power pads disposed adjacent to a second side edge of the master memory chip. The slave memory chip includes slave external pads and slave internal pads disposed adjacent to a first side edge of the slave memory chip; and slave power pads disposed adjacent to a second side edge of the slave memory chip. A portion of the bond fingers is electrically connected to the master external pads through external bonding wires, and the master internal pads are electrically connected to the slave internal pads through internal bonding wires, respectively, and the slave external pads are floated.

In accordance with an embodiment of the present disclosure, a semiconductor package includes: a substrate including signal bond fingers disposed adjacent to a first side and first power bond fingers and second power bond fingers disposed adjacent to a second side; a master memory chip stacked over the substrate; and a lower slave memory chip stacked over the master memory chip. The master memory chip includes master external pads; master internal pads; and master power pads electrically connected to the first power bond fingers. The lower slave memory chip includes lower slave external pads; lower slave internal pads; and lower slave power pads electrically connected to the second power bond fingers. The signal bond fingers are electrically connected to the master external pads through external bonding wires, respectively. The master internal pads are electrically connected to the lower slave internal pads through lower internal bonding wires, respectively. The master external pads and the lower slave external pads are not connected through the bonding wires.

In accordance with an embodiment of the present disclosure, a semiconductor package includes: a substrate having signal bond fingers, master power bond fingers, and slave power bond fingers; a master memory chip mounted on the substrate and including master external pads, master internal pads, and master power pads; a slave memory chip stacked over the master memory chip and including slave external pads, slave internal pads, and slave power pads; external bonding wires electrically connecting the signal bond fingers and the master external pads, respectively; internal bonding wires electrically connecting the master internal pads and the slave internal pads, respectively; master power bonding wires electrically connecting the master power bond fingers and the master power pads, respectively; and slave power bonding wires electrically connecting the slave power bond fingers and the slave power pads, respectively. The master external pads are disposed in a column adjacent to a first side edge of the master chip. The master internal pads are disposed in a column adjacent to the master external pads. The slave external pads are disposed in a column adjacent to the first side edge of the slave chip. The slave internal pads are disposed in a column adjacent to the slave external pads. The slave external pads of the slave memory chip are floated.

BRIEF DESCRIPTION OF THE DRAWINGS

FIG. 3A is a top view of a semiconductor package in accordance with an embodiment of the present disclosure, and FIG. 3B is a side view taken along a line I-I' of FIG. 3A, and FIG. 3C is a side view taken along a line II-II' of FIG. 3A.

FIGS. 4A and 4B are views illustrating an arrangement of internal circuit blocks and internal electrical signal paths of a master memory chip in accordance with an embodiment of the present disclosure.

FIG. 6 is a top view schematically illustrating a substrate in accordance with an embodiment of the present disclosure.

FIGS. 8A and 8B are top and side views of a semiconductor package in accordance with an embodiment of the present disclosure.

DETAILED DESCRIPTION

Figure 1A:
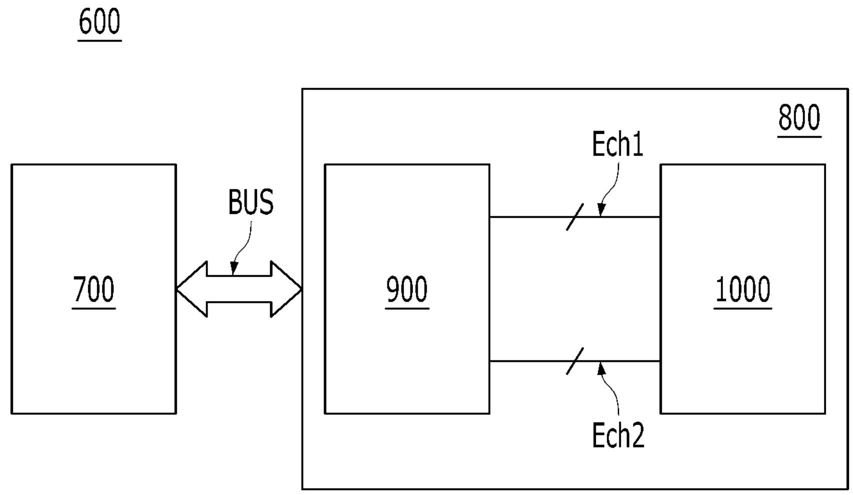
FIG. 1A is a schematic block diagram illustrating an electronic system in accordance with an embodiment of the present disclosure.

Embodiments of the present disclosure will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout this disclosure, like reference numerals refer to like parts throughout the various figures and embodiments of the present disclosure.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1A is a schematic block diagram illustrating an electronic system 600 in accordance with an embodiment of the present disclosure. Referring to FIG. 1A, the electronic system 600 may include a host 700 and a memory system 800.

The host 700 may include one of a server, a processor, and a computing system. The processor may include at least one of processing units such as a Central Processing Unit (CPU), an Application Processor (AP), and a Micro Control Unit (MCU). The electronic system 600 may further include bus lines BUS that electrically connect the host 700 to the memory system 800. The host 700 and the memory system 800 may communicate with each other through bus lines BUS.

The memory system 800 may include a memory controller 900 and a memory unit 1000. The memory controller 900 may receive various signals from the host 700 and transfer the signals to the memory unit 1000, and may receive data from the memory unit 1000 and transfer the data to the host 700. The memory unit 1000 may store data. The memory system 800 may further include first external channels Ech1 and second external channels Ech2. The first external channels Ech1 and the second external channels Ech2 may electrically connect the memory controller 900 to the memory unit 1000. The memory controller 900 and the memory unit 1000 may communicate with each other through the first external channels Ech1 and the second external channels Ech2. For example, the first external channels Ech1 may transfer data signals and a data strobe signal. The second external channels Ech2 may transfer an external clock signal, an external chip selection signal, an external command signal, and an external address signal. According to an embodiment of the present disclosure, 'communicate' may be interpreted as meaning that electrical signals are transmitted to and received from one element from another. That is, 'not communicate' may be interpreted as meaning that electrical signals are not transmitted to and received from different elements.

Figure 1B:
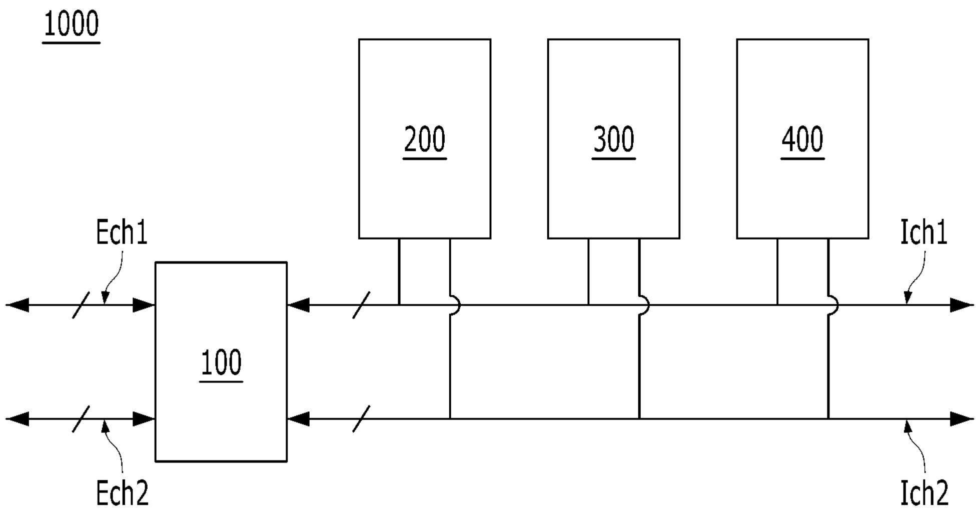
FIG. 1B is a schematic block diagram illustrating a semiconductor package in accordance with an embodiment of the present disclosure.

FIG. 1B is a schematic block diagram illustrating the memory unit 1000 in accordance with an embodiment of the present disclosure. Referring to FIG. 1B, the memory unit 1000 may include one master memory chip 100 and a plurality of slave memory chips 200 to 400. Although three slave memory chips 200 to 400 are illustrated in the drawing, the memory unit 1000 may include one or more slave memory chips. For example, the memory unit 1000 may include seven or more slave memory chips.

The master memory chip 100 may communicate with the memory controller 900 through the first external channels Ech1 and the second external channels Ech2. The master memory chip 100 may communicate with the slave memory chips 200 to 400 through first internal channels Ich1 and second internal channels Ich2.

The slave memory chips 200 to 400 may communicate with the memory controller 900 through the first and second internal channels Ich1 and Ich2, the master memory chip 100, and the first and second external channels Ech1 and Ech2.

The memory unit 1000 may be provided in a module form, for example, a package form. The first external channels Ech1 and the first internal channels Ich1 may transfer data signals and a data strobe signal. The second external channels Ech2 and the second internal channels Ich2 may transfer a clock signal, a chip selection signal, a command signal, an address signal, and a control signal.

Figure 2A:
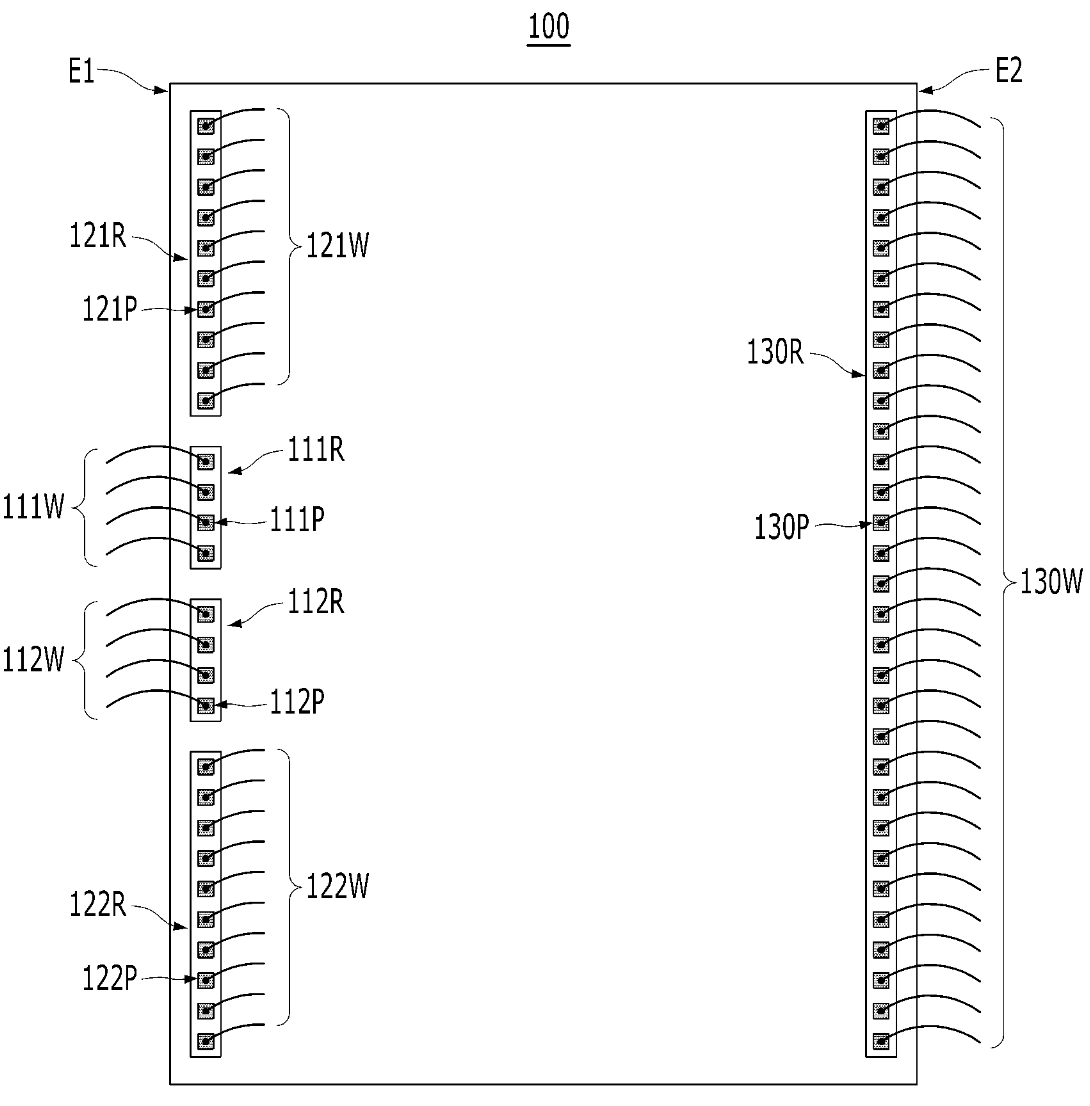
FIG. 2A is a top view illustrating a master memory chip in accordance with an embodiment of the present disclosure.

FIG. 2A is a top view illustrating the master memory chip 100 in accordance with an embodiment of the present disclosure. Referring to FIG. 2A, the master memory chip 100 may include a first master external pad region 111R, a second master external pad region 112R, and a first master internal pad region 121R, a second master internal pad region 122R, and a master power pad region 130R.

The first master external pad region 111R, the second master external pad region 112R, the first master internal pad region 121R, and the second master internal pad region 122R may be disposed adjacent to a first side edge E1 of the master memory chip 100. The first master external pad region 111R, the second master external pad region 112R, the first master internal pad region 121R, and the second master internal pad region 122R may be disposed side by side to form one column. According to an embodiment of the present disclosure, the first master external pad region 111R and the second master external pad region 112R may be disposed side-by-side to be close to a middle portion of the first side edge E1. The first master internal pad region 121R and the second master internal pad region 122R may be disposed to be separated to be close to both side portions of the first side edge E1. According to another embodiment of the present disclosure, the first master external pad region 111R and the second master external pad region 112R may be separately disposed on both side portions, and the first master internal pad region 121R and the second master internal pad region 122R may be disposed in the middle portion. The master power pad region 130R may be disposed adjacent to a second side edge E2 of the master memory chip 100 to form one column. The first side edge E1 and the second side edge E2 may be disposed opposite to each other.

First master external pads 111P may be disposed in the first master external pad region 111R. Second master external pads 112P may be disposed in the second master external pad region 112R. First master internal pads 121P may be disposed in the first master internal pad region 121R. Second master internal pads 122P may be disposed in the second master internal pad region 122R. Master power pads 130P may be disposed in the master power pad region 130R.

The first master external pads 111P may be electrically connected to the first external bonding wires 111W, respectively. The first external bonding wires 111W may be electrically connected to the first external channels Ech1, respectively. According to an embodiment of the present disclosure, the first external bonding wires 111W may respectively correspond to portions of the first external channels Ech1.

The second master external pads 112P may be electrically connected to the second external bonding wires 112W, respectively. The second external bonding wires 112W may be electrically connected to the second external channels Ech2, respectively. According to an embodiment of the present disclosure, the second external bonding wires 112W may respectively correspond to portions of the second external channels Ech2.

The first master internal pads 121P may be electrically connected to the first lower internal bonding wires 121W, respectively. The second master internal pads 122P may be electrically connected to the second lower internal bonding wires 122W, respectively. The master power pads 130P may be electrically connected to the master power bonding wires 130W.

Figure 2B:
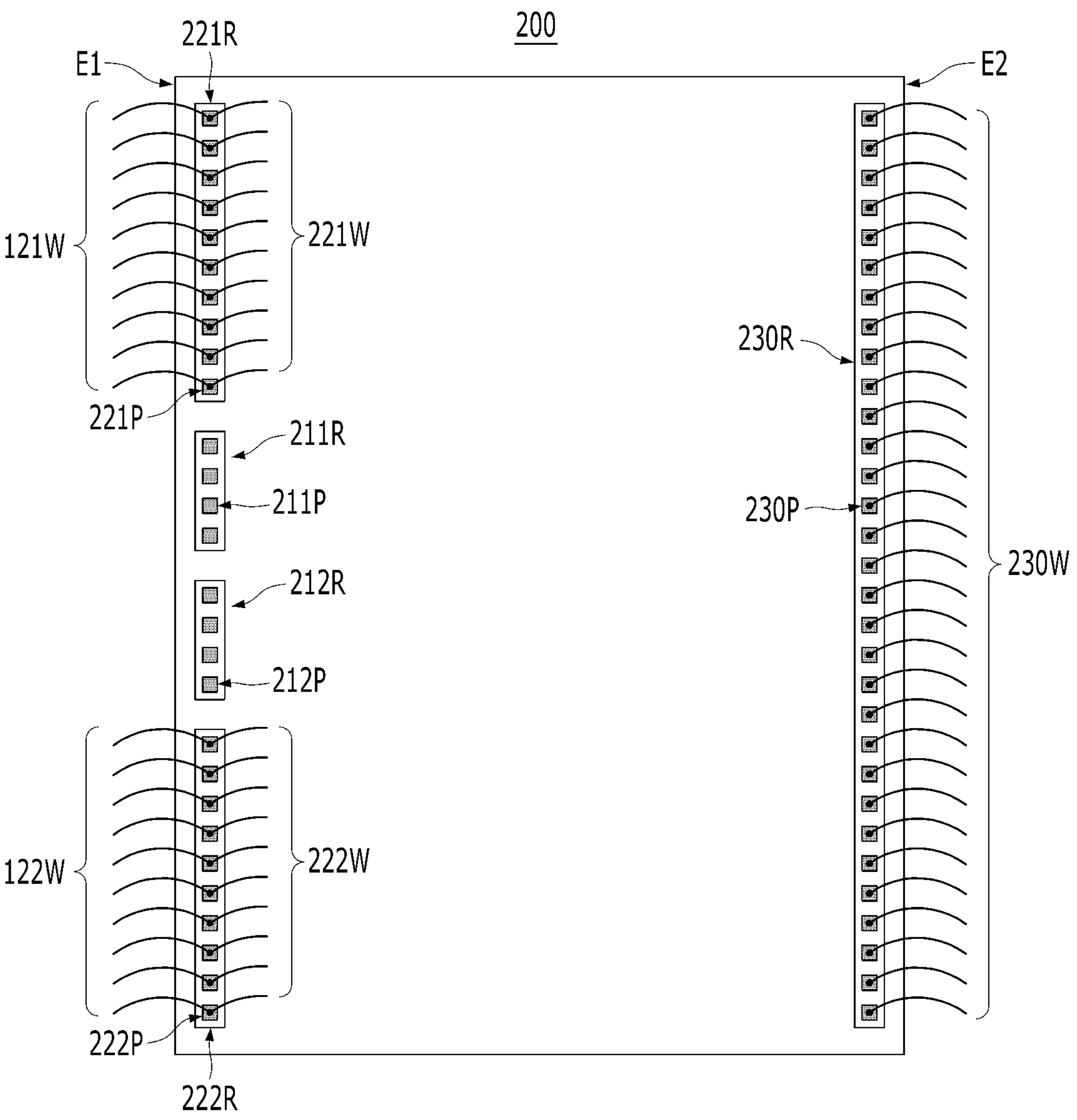
FIG. 2B is a top view illustrating a lower slave memory chip in accordance with an embodiment of the present disclosure.

FIG. 2B is a top view illustrating a lower slave memory chip in accordance with an embodiment of the present disclosure. Referring to FIG. 2B, the lower slave memory chip 200 may include a first lower slave external pad region 211R, a second lower slave external pad region 212R, a first lower slave internal pad region 221R, a second lower slave internal pad region 222R, and a lower slave power pad region 230R. The arrangement of the first lower slave external pad region 211R, the second lower slave external pad region 212R, the first lower slave internal pad region 221R, and the second lower slave internal pad region 222R and the lower slave power pad region 230R of the lower slave memory chip 200 may be the same as the arrangement of the first master external pad region 111R, the second master external pad region 112R, the first master internal pad region 121R, the second master internal pad region 122R, and the master power pad region 130R of the master memory chip 100.

First lower slave external pads 211P may be disposed in the first lower slave external pad region 211R. Second lower slave external pads 212P may be disposed in the second lower slave external pad region 212R. First lower slave internal pads 221P may be disposed in the first lower slave internal pad region 221R. Second lower slave internal pads 222P may be disposed in the second lower slave internal pad region 222R. Lower slave power pads 230P may be disposed in the lower slave power pad region 230R. An arrangement of the first lower slave external pads 211P, the second lower slave external pads 212P, the first lower slave internal pads 221P, the second lower slave internal pads 222P, and the lower slave power pads 230P of the lower slave memory chip 200 may be the same as an arrangement of the first master external pads 111P, the second master external pads 112P, the first master internal pads 121P, the second master internal pads 122P, and the master power pads 130P of the master memory chip 100.

The first and second lower slave external pads 211P and 212P of the lower slave memory chip 200 might not be connected to the first and second external channels Ech1 and Ech2. Each of the first lower slave external pads 211P and the second lower slave external pads 212P of the lower slave memory chip 200 may be floated.

The first lower slave internal pads 221P may be electrically connected to the first intermediate internal bonding wires 221W, respectively. The first lower slave internal pads 221P of the lower slave memory chip 200 may be electrically connected to the first lower internal bonding wires 121W of the master memory chip 100, respectively. Accordingly, the first lower slave internal pads 221P of the lower slave memory chip 200 may be connected in common to the first lower internal bonding wires 121W of the master memory chip 100 and the first intermediate internal bonding wires 221W of the lower slave memory chip 200.

The second lower slave internal pads 222P may be electrically connected to the second intermediate internal bonding wires 222W, respectively. The second lower slave internal pads 222P of the lower slave memory chip 200 may be electrically connected to the second lower internal bonding wires 122W of the master memory chip 100, respectively. Accordingly, the second lower slave internal pads 222P of the lower slave memory chip 200 may be connected in common to the second lower internal bonding wires 122W of the master memory chip 100 and the second intermediate internal bonding wires 222W of the lower slave memory chip 200.

The lower slave power pads 230P may be electrically connected to the lower slave power bonding wires 230W, respectively.

Figure 2C:
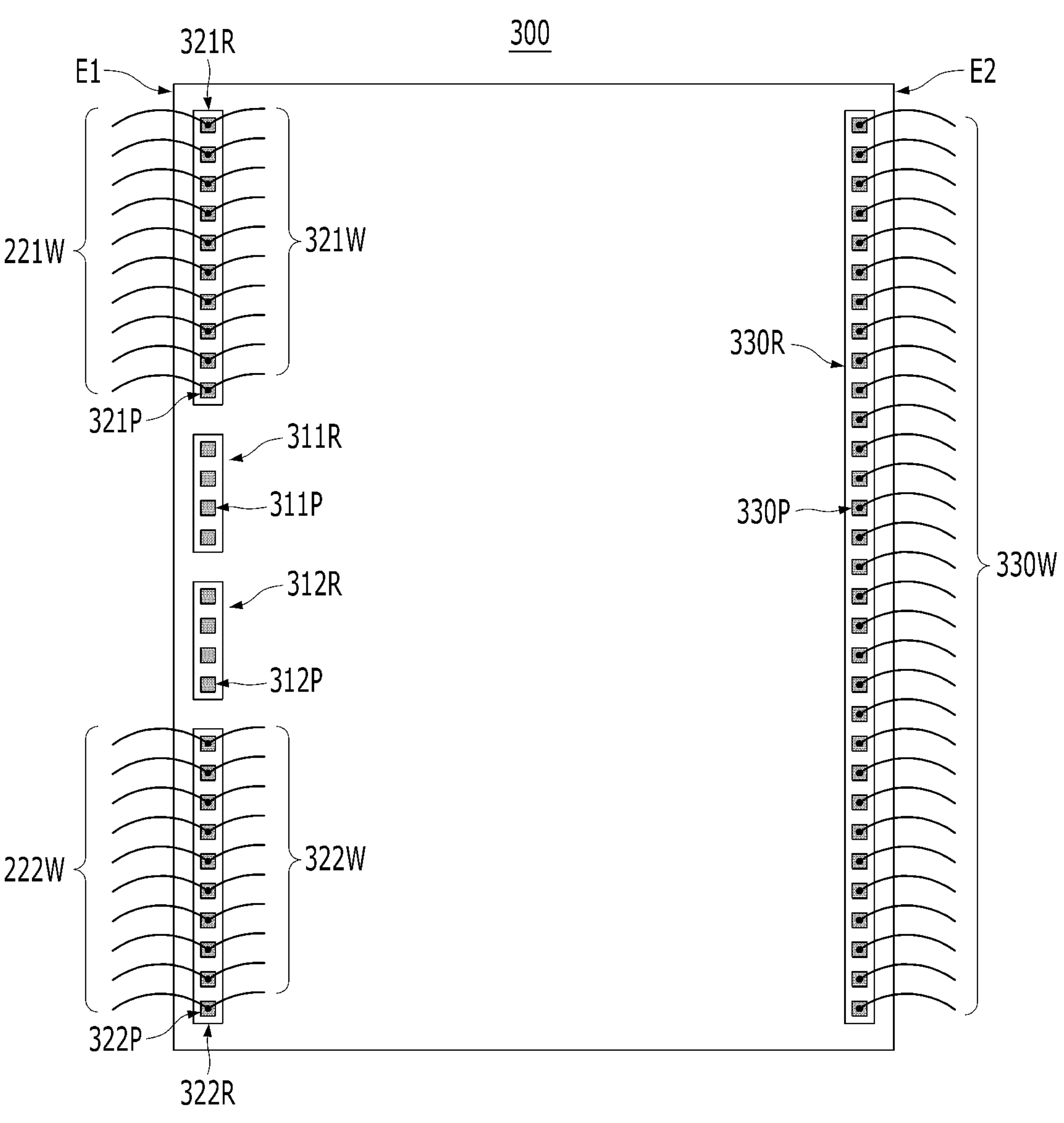
FIG. 2C is a top view illustrating an intermediate slave memory chip in accordance with an embodiment of the present disclosure.

FIG. 2C is a top view illustrating an intermediate slave memory chip 300 in accordance with an embodiment of the present disclosure. Referring to FIG. 2C, the intermediate slave memory chip 300 may include a first intermediate slave external pad region 311R, a second intermediate slave external pad region 312R, a first intermediate slave internal pad region 321R, a second intermediate slave internal pad region 322R, and an intermediate slave power pad region 330R. An arrangement of the first intermediate slave external pad region 311R, the second intermediate slave external pad region 312R, the first intermediate slave internal pad region 321R, and the second intermediate slave internal pad region 322R, and the intermediate slave power pad region 330R of the intermediate slave memory chip 300 may be the same as the arrangement of the first master external pad region 111R, the second master external pad region 112R, the first master internal pad region 121R, the second master internal pad region 122R, and the master power pad region 130R.

First intermediate slave external pads 311P may be disposed in the first intermediate slave external pad region 311R. Second intermediate slave external pads 312P may be disposed in the second intermediate slave external pad region 312R. First intermediate slave internal pads 321P may be disposed in the first intermediate slave internal pad region 321R. Second intermediate slave internal pads 322P may be disposed in the second intermediate slave internal pad region 322R. Intermediate slave power pads 330P may be disposed in the intermediate slave power pad region 330R. An arrangement of the first intermediate slave external pads 311P, the second intermediate slave external pads 312P, the first intermediate slave internal pads 321P, the second intermediate slave internal pads 322P, and the intermediate slave power pads 330P of the intermediate slave memory chip 300 may be the same as the arrangement of the first master external pads 111P, the second master external pads 112P, the first master internal pads 121P, the second master internal pads 122P, and the master power pads 130P of the master memory chip 100.

The first and second intermediate slave external pads 311P and 312P of the intermediate slave memory chip 300 might not be connected to the first and second external channels Ech1 and Ech2. Each of the first intermediate slave external pads 311P and the second intermediate slave external pads 312P of the intermediate slave memory chip 300 may be floated.

The first intermediate slave internal pads 321P may be electrically connected to the first upper internal bonding wires 321W, respectively. The first intermediate slave internal pads 321P of the intermediate slave memory chip 300 may be electrically connected to the first intermediate internal bonding wires 221W of the lower slave memory chip 200, respectively. Accordingly, the first intermediate slave internal pads 321P of the intermediate slave memory chip 300 may be connected in common to the first intermediate internal bonding wires 221W of the lower slave memory chip 200 and the first upper internal bonding wires 321W of the intermediate slave memory chip 300.

The second intermediate slave internal pads 322P may be electrically connected to the second upper internal bonding wires 322W, respectively. The second intermediate slave internal pads 322P of the intermediate slave memory chip 300 may be electrically connected to the second intermediate internal bonding wires 222W of the lower slave memory chip 200, respectively. Accordingly, the second intermediate slave internal pads 322P of the intermediate slave memory chip 300 may be connected in common to the second intermediate internal bonding wires 222W of the lower slave memory chip 200 and the second upper internal bonding wires 322W of the intermediate slave memory chip 300.

The intermediate slave power pads 330P may be electrically connected to the intermediate slave power bonding wires 330W, respectively.

Figure 2D:
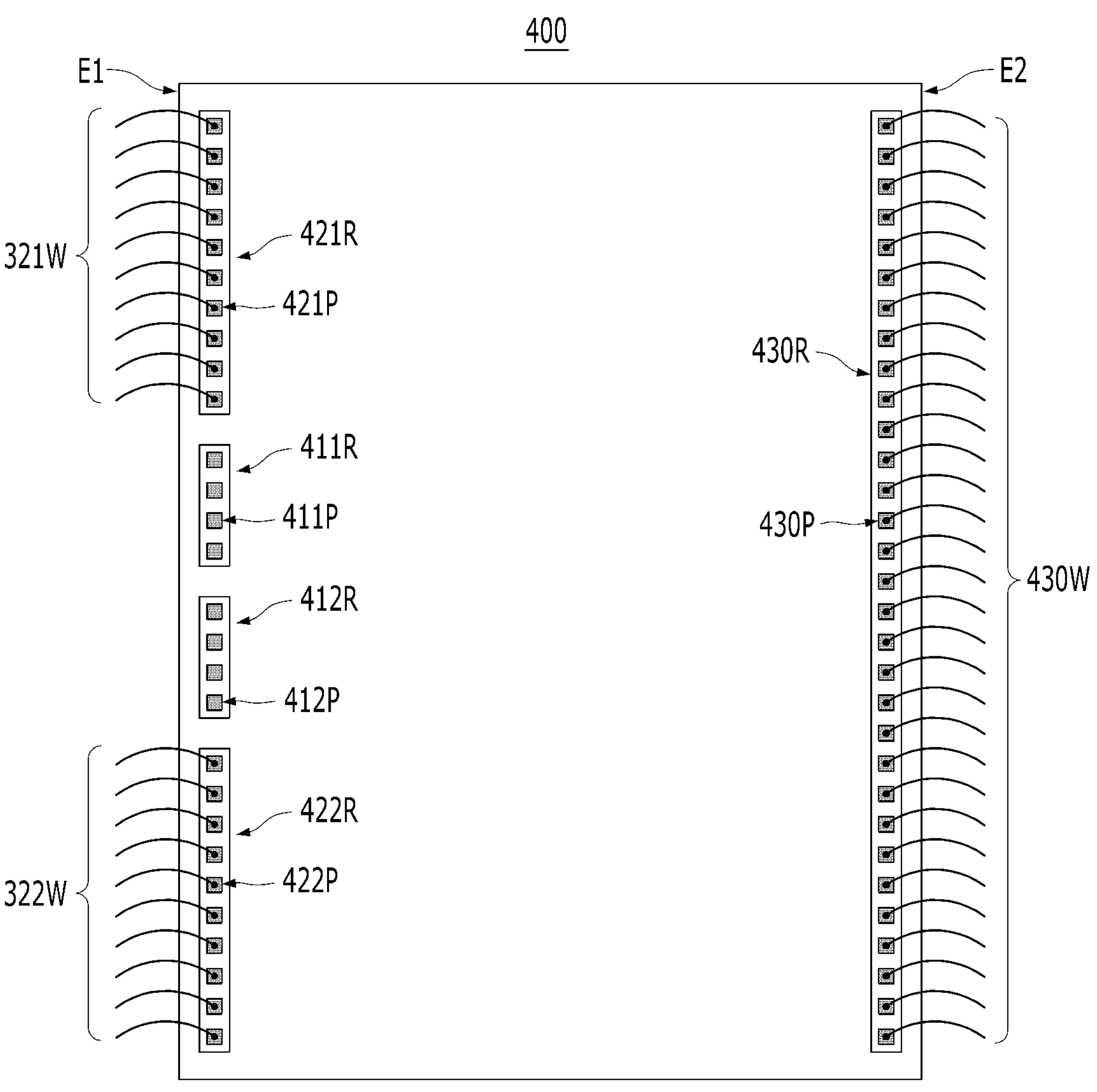
FIG. 2D is a top view illustrating an upper slave memory chip in accordance with an embodiment of the present disclosure.

FIG. 2D is a top view illustrating an upper slave memory chip 400 in accordance with an embodiment of the present disclosure. Referring to FIG. 2D, the upper slave memory chip 400 may include a first upper slave external pad region 411R, a second upper slave external pad region 412R, a first upper slave internal pad region 421R, a second upper slave internal pad region 422R, and an upper slave power pad region 430R. An arrangement of the first upper slave external pad region 411R, the second upper slave external pad region 412R, the first upper slave internal pad region 421R, the second upper slave internal pad region 422R, and the upper slave power pad region 430R of the upper slave memory chip 400 may be the same as the arrangement of the first master external pad region 111R, the second master external pad region 112R, the first master internal pad region 121R, the second master internal pad region 122R, and the master power pad region 130R of the master memory chip 100.

The first upper slave external pads 411P may be disposed in the first upper slave external pad region 411R. Second upper slave external pads 412P may be disposed in the second upper slave external pad region 412R. First upper slave internal pads 421P may be disposed in the first upper slave internal pad region 421R. Second upper slave internal pads 422P may be disposed in the second upper slave internal pad region 422R. Upper slave power pads 430P may be disposed in the upper slave power pad region 430R.

The arrangement of the first upper slave external pads 411P, the second upper slave external pads 412P, the first upper slave internal pads 421P, the second upper slave internal pads 422P, and the upper slave power pads 430P of the upper slave memory chip 400 may be the same as the arrangement of the first master external pads 111P, the second master external pads 112P, the first master internal pads 121P, the second master internal pads 122P, and the master power pads 130P of the master memory chip 100.

The first and second upper slave external pads 411P and 412P of the upper slave memory chip 400 might not be connected to the first and second external channels Ech1 and Ech2. Each of the first upper slave external pads 411P and the second upper slave external pads 412P of the upper slave memory chip 400 may be floated.

The first upper slave internal pads 421P of the upper slave memory chip 400 may be electrically connected to the first upper internal bonding wires 321W of the intermediate slave memory chip 300, respectively.

The second upper slave internal pads 422P of the upper slave memory chip 400 may be electrically connected to the second upper internal bonding wires 322W of the intermediate slave memory chip 300, respectively.

The upper slave power pads 430P may be electrically connected to the upper slave power bonding wires 430W, respectively.

Figure 3A:
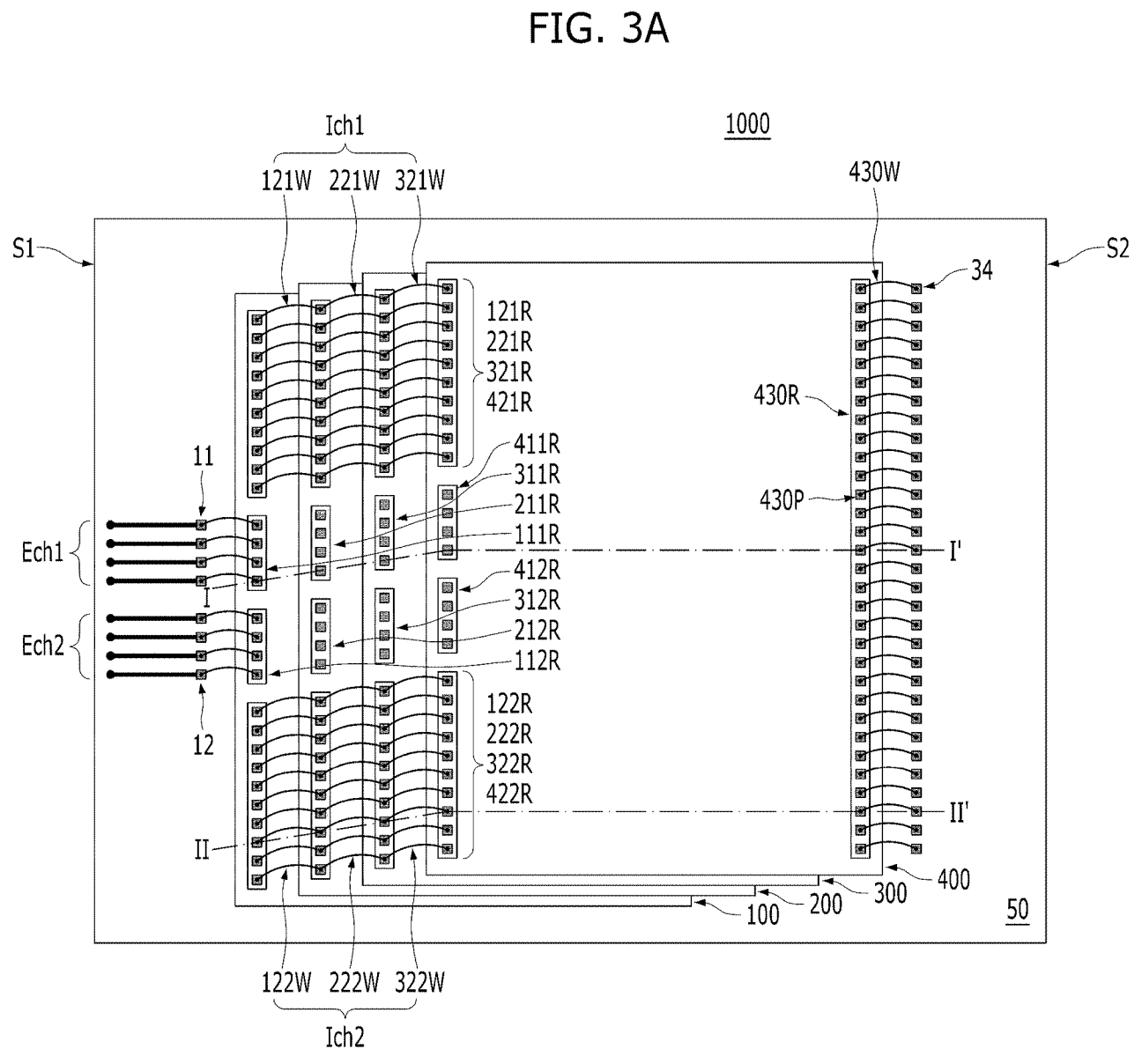
Figure 3B:
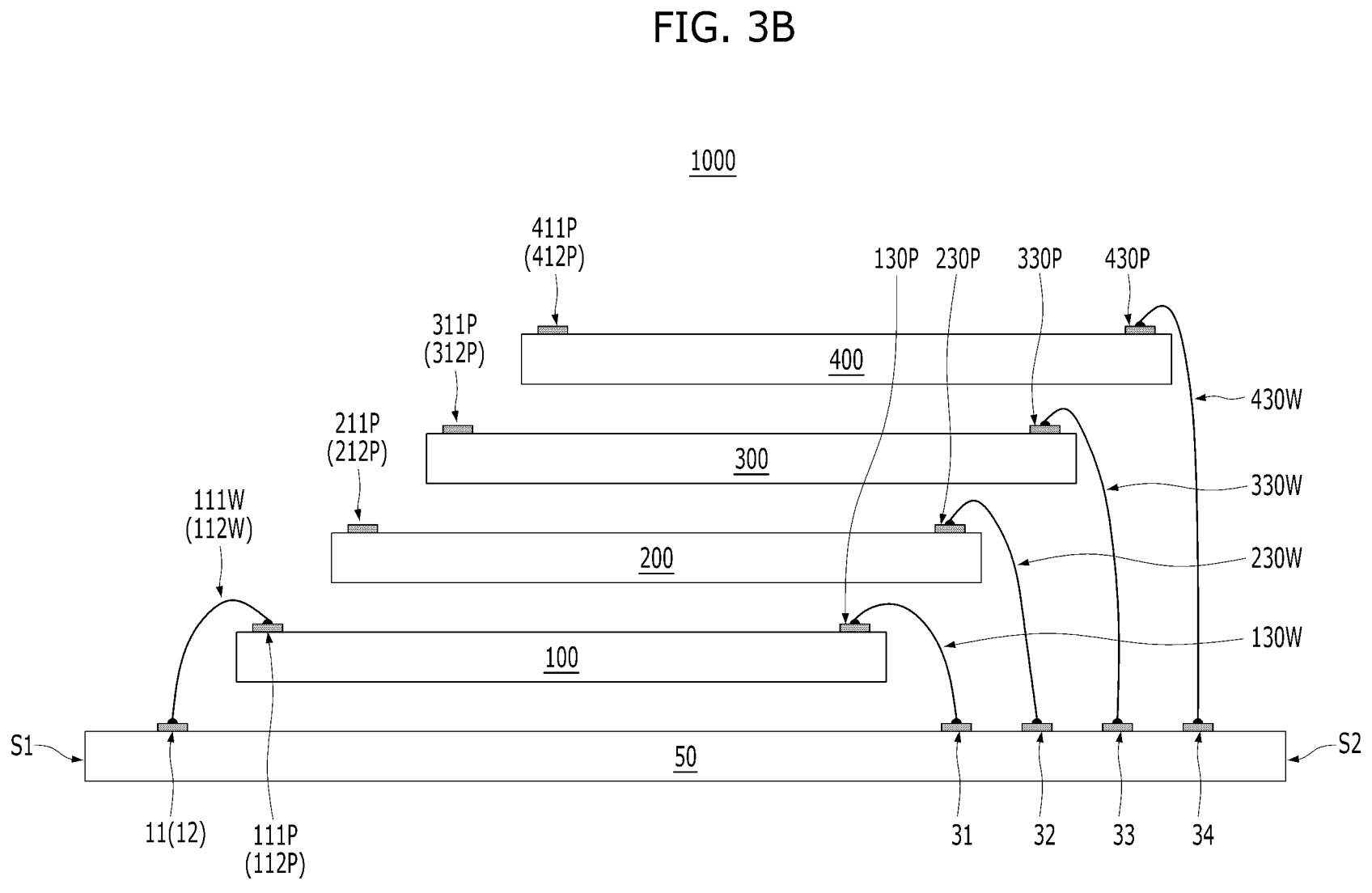

FIG. 3A is a top view of a semiconductor package 1000 in accordance with an embodiment of the present disclosure, and FIG. 3B is a side view taken along a line I-I' of FIG. 3A, and FIG. 3C is a side view taken along a line II-II' of FIG. 3A. Referring to FIGS. 3A to 3C, the semiconductor package 1000 may include the master memory chip 100 mounted on the substrate 50, and the slave memory chips 200, 300, and 400 stacked over the master memory chip 100. The master memory chip 100 and the slave memory chips 200 to 400 may be offset stacked in a staircase shape. The slave memory chips 200 to 400 may include the lower slave memory chip 200, the intermediate slave memory chip 300, and the upper slave memory chip 400. The substrate 50 may include a package substrate, such as a printed circuit board (PCB). The substrate 50 may include first external channels Ech1 and second external channels Ech2 disposed therein. First signal bond fingers 11, second signal bond fingers 12, and first to fourth power bond fingers 31 to 34 may be disposed on the top surface of the substrate 50. The first and second external channels Ech1 and Ech2, and the first and second signal bond fingers 11 and 12 may be disposed adjacent to a first side S1 of the substrate 50. For example, the first and second external channels Ech1 and Ech2 and the first and second signal bond fingers 11 and 12 may be disposed adjacent to a first side edge E1 of each of the memory chips 100 to 400. The power pads 130P, 230P, 330P and 430P and the first to fourth power bond fingers 31 to 34 may be disposed adjacent to a second side S2 of the substrate 50. For example, the power pads 130P, 230P, 330P and 430P and the first to fourth power bond fingers 31 to 34 may be disposed adjacent to the second side edges E2 of the respective memory chips 100 to 400. For example, the memory chips 100 to 400 may be mounted and stacked in such a manner that the first side edge E1 of the master memory chip 100 is adjacent to the first and second external channels Ech1 and Ech2 of the substrate 50 and the first and second signal bond fingers 11 and 12. Although the semiconductor package 1000 is illustrated as including four memory chips 100 to 400 in this embodiment of the present disclosure, the semiconductor package 1000 may include two or more memory chips according to other embodiments of the present disclosure. For example, according to an embodiment of the present disclosure, the semiconductor package 1000 may include the master memory chip 100 and an upper slave memory chip 400. According to another embodiment of the present disclosure, the semiconductor package 1000 may include the master memory chip 100, a plurality of lower slave memory chips 200 or a plurality of intermediate slave memory chips 300, and the upper slave memory chip 400.

Referring further to FIG. 2A, the first master external pads 111P of the master memory chip 100 may be respectively connected to first signal bond fingers 11 over the substrate 50 through the first external bonding wires 111W. The first signal bond fingers 11 of the substrate 50 and the first master external pads 111P of the master memory chip 100 may be disposed adjacent to each other. The first signal bond fingers 11 may be connected to first external channels Ech1 in the substrate 50. The second master external pads 112P of the master memory chip 100 may be respectively connected to the second signal bond fingers 12 over the substrate 50 through the second external bonding wires 112W. The second signal bond fingers 12 of the substrate 50 and the second master external pads 112P of the master memory chip 100 may be disposed adjacent to each other. The second signal bond fingers 12 may be connected to the second external channels Ech2 in the substrate 50. The first and second signal bond fingers 11 and 12 might not be connected to the first and second master internal pads 121P and 122P.

Referring further to FIGS. 2B to 2D, the first lower, intermediate, and upper slave external pads 211P, 311P and 411P and the second lower, intermediate, and upper slave external pads 212P, 312P and 412P of the slave memory chips 200 to 400 may be floated. That is, the first lower, intermediate, and upper slave external pads 211P, 311P and 411P and the second lower, intermediate, and upper slave external pads 212P, 312P and 412P of the slave memory chips 200 to 400 might not be connected to any bonding wires.

Referring further to FIGS. 2A to 2D, the first master internal pads 121P of the master memory chip 100, the first lower slave internal pads 221P of the lower slave memory chip 200, the first intermediate slave internal pads 321P of the intermediate slave memory chip 300, and the first upper slave internal pads 421P of the upper slave memory chip 400 may be electrically connected to each other through the first lower, intermediate, and upper internal bonding wires 121W, 221W and 321W. The second master internal pads 122P of the master memory chip 100, the second lower slave internal pads 222P of the lower slave memory chip 200, the second intermediate slave internal pads 322P of the intermediate slave memory chip 300, and the second upper slave internal pads 422P of the upper slave memory chip 400 may be electrically connected to each other through the second lower, intermediate, and upper internal bonding wires 122W, 222W and 322W. The first lower, intermediate, and upper internal bonding wires 121W, 221W and 321W may form the first internal channels Ich1, and the second lower, intermediate, and upper internal bonding wires 122W, 222W and 322W may form the second internal channels Ich2.

The power pads 130P, 230P, 330P and 430P of the master memory chip 100, the lower slave memory chip 200, the intermediate slave memory chip 300, and the upper slave memory chip 400 may be independently electrically connected to the power bond fingers 31 to 34 of the substrate 50, respectively, through the power bonding wires 130W, 230W, 330W and 430W. For example, the master power pads 130P of the master memory chip 100 may be electrically connected to the first power bond fingers 31 of the substrate 50 through the master power bonding wire 130W. The lower slave power pads 230P of the slave memory chip 200 may be electrically connected to the second power bond fingers 32 of the substrate, and the intermediate slave power pads 330P of the intermediate slave memory chip 300 may be electrically connected to the third power bond fingers 33 of the substrate. The upper slave power pads 430P of the upper slave memory chip 400 may be electrically connected to the fourth power bond fingers 34 of the substrate. In the substrate 50, the first to fourth power bond fingers 31 to 34 may be selectively electrically connected with each other. For example, among the first to fourth power bond fingers 31 to 34, the power bond fingers that transfer and provide the same power may be selectively electrically connected with each other. The power may include a drain voltage VDD, a source voltage VSS, a boost voltage VPP, or other common voltages. The first power bond fingers 31 may be master power bond fingers for providing a voltage to the master memory chip 100. The second power bond fingers 32 may be lower slave power bond fingers for providing a voltage to the lower slave memory chip 200. The third power bond fingers 33 may be intermediate slave power bond fingers for providing a voltage to the intermediate slave memory chip 300. The fourth power bond fingers 34 may be upper slave power bond fingers for providing a voltage to the upper slave memory chip 400.

According to the inventive concept of the present disclosure, the signal bond fingers 11 and 12 of the substrate 50 may be electrically connected to the external pads 111P and 112P of the master memory chip 100 through the external bonding wires 111W and 112W. The signal bond fingers 11 and 12 of the substrate 50 might not be connected to the external pads 211P, 212P, 311P, 312P, 411P and 412P of the slave memory chips 200 to 400. The first internal pads 121P, 221P, 321P and 421P of the memory chips 100 to 400 may be electrically connected to each other through the first internal bonding wires 121W, 221W and 321W. The second internal pads 122P, 222P, 322P and 422P of the memory chips 100 to 400 may be electrically connected to each other through the second internal bonding wires 122W, 222W and 322W.

According to an embodiment of the present disclosure, in inventive concepts of the present disclosure, the power pads 130P, 230P, 330P and 430P of the memory chips 100 to 400 may be electrically connected to the first to fourth power bond fingers 31, 32, 33 and 34 through the power bonding wires 130W, 320W, 330W and 430W in a one-to-one manner, respectively.

Spacing elements for adhering and supporting the memory chips 100 to 400 to each other may be disposed between the memory chips 100 to 400. The spacing elements may include dummy elements and/or adhesive films.

Figure 4A:
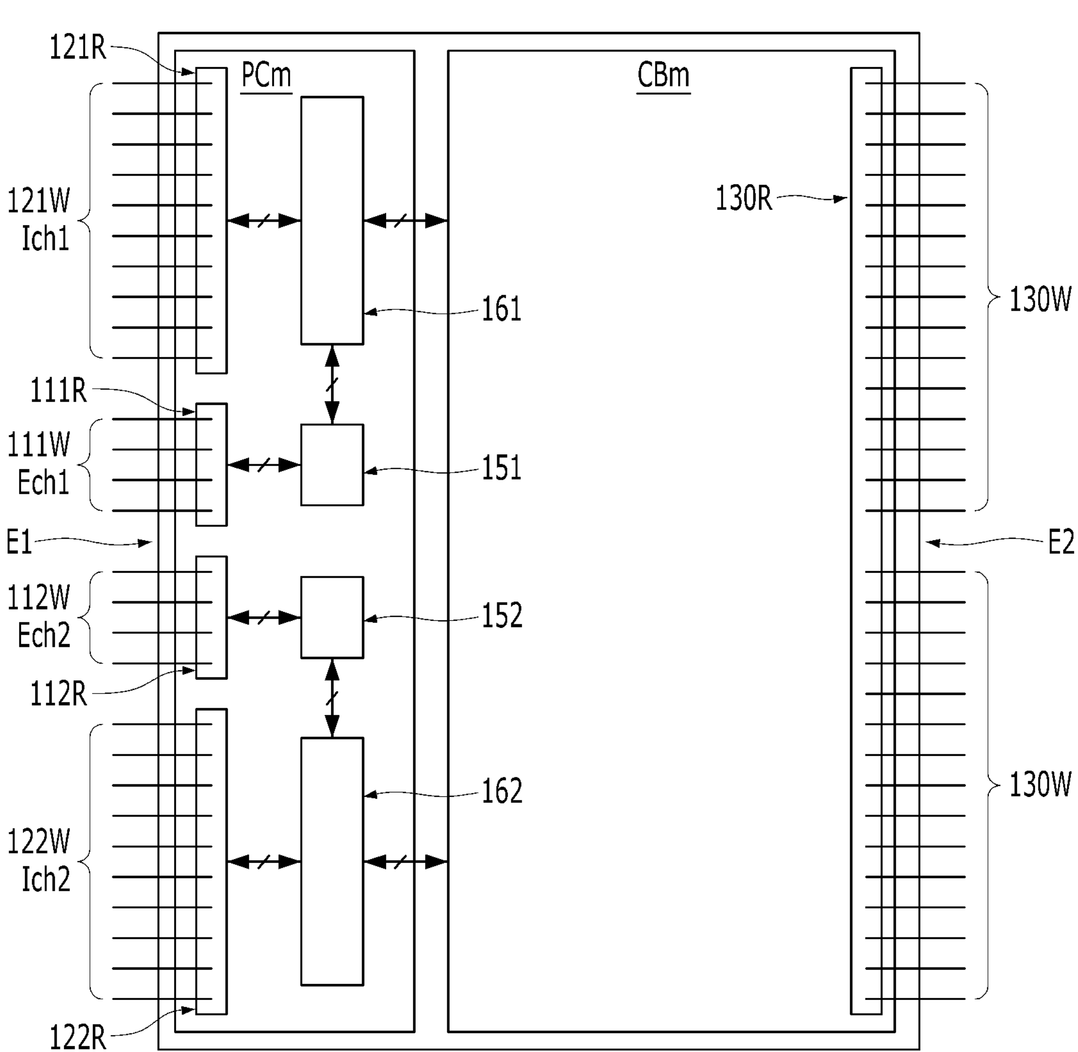
Figure 4B:
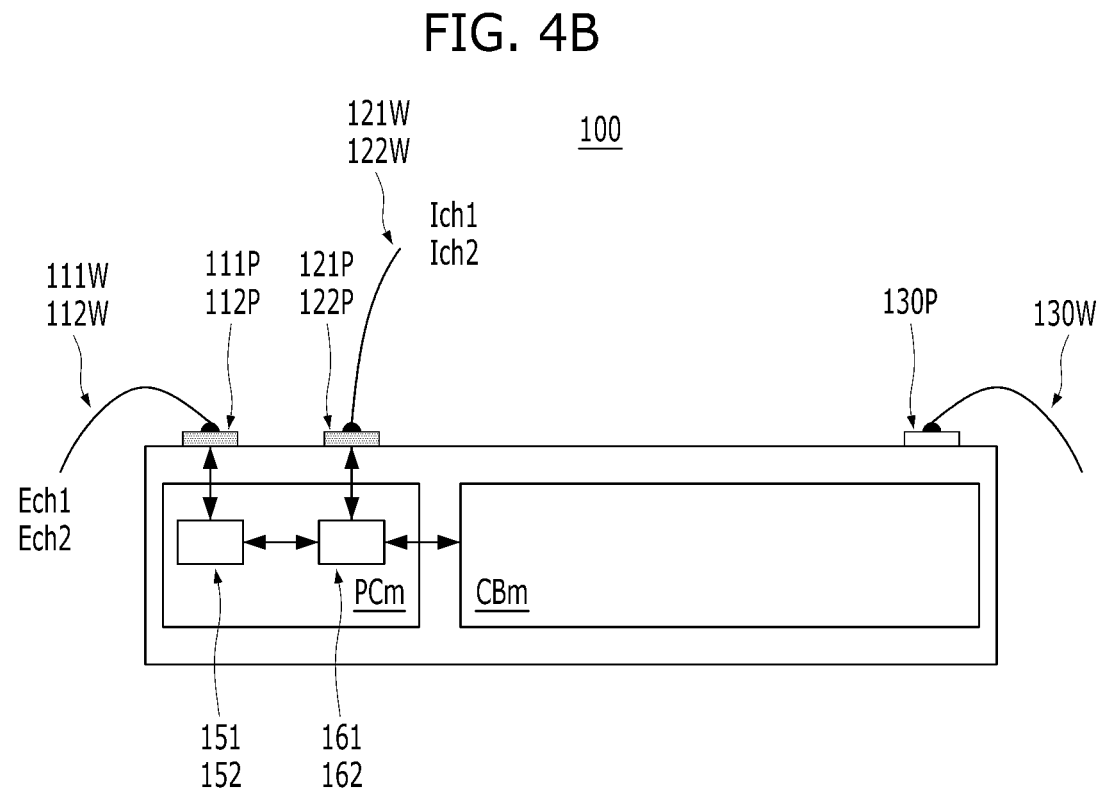

FIGS. 4A and 4B illustrate an arrangement of internal circuit blocks and internal electrical signal paths of the master memory chip 100 in accordance with an embodiment of the present disclosure. The internal electrical signal paths are indicated using arrows. The double-headed arrows may mean internal interconnections.

Referring to FIGS. 4A and 4B, the master memory chip 100 according to the embodiment of the present disclosure may include a master cell bank area CBm and a master peripheral circuit area PCm. The master peripheral circuit area PCm may be disposed adjacent to the first side edge E1. The master cell bank area CBm may be disposed adjacent to the second side edge E2. According to an embodiment of the present disclosure, the master peripheral circuit area PCm may overlap with or be adjacent to the master pad regions 111R, 112R, 121R and 122R. The master cell bank area CBm may overlap with or be adjacent to the power pad region (refer to 130R of FIG. 2A). The master cell bank area CBm may include master memory cell blocks and master core blocks. The master peripheral circuit area PCm may include the first master external circuit block 151, the second master external circuit block 152, the first master internal circuit block 161, and the second master internal circuit block 162. According to an embodiment of the present disclosure, the first master external circuit block 151 may include a master data buffer. The second master external circuit block 152 may include a master signal buffer. The first master internal circuit block 161 may include a master data serializing/de-serializing circuit. The second master internal circuit block 162 may include a master signal decoding circuit.

The first master external circuit block 151 may be disposed adjacent to the first master external pads 111P in the first master external pad region 111R. The first master external circuit block 151 may be electrically connected to the first master external pads 111P in the first master external pad region 111R and communicate with the memory controller 900 through the first external channel Ech1. The first master external circuit block 151 may be electrically connected to and communicate with the first master internal circuit block 161 through internal interconnections. Accordingly, the first master external circuit block 151 may receive data signals and the data strobe signal from the memory controller 900 through the first external channel Ech1 and transfer them to the first master internal circuit block 161. The first master external circuit block 151 may receive the data signals from the first master internal circuit block 161 and provide the received data signals to the memory controller 900 through the first external channel Ech1.

The first master internal circuit block 161 may be disposed adjacent to the first master internal pads 121P in the first master internal pad region 121R. The first master internal circuit block 161 may be electrically connected to the first master internal pads 121P in the first master internal pad region 121R and communicate with the slave memory chips 200 to 400 through the first internal channel Ich1. The first master internal circuit block 161 may transfer the electrical signals received from the first master external circuit block 151 to the first internal channel Ich1. According to an embodiment of the present disclosure, the electrical signals provided from the first master external circuit block 151 may be directly provided to the first internal channel Ich1 without electrically passing through the first master internal circuit block 161. The first master internal circuit block 161 may transfer the electrical signals received from the first internal channel Ich1 to the first master external circuit block 151. According to an embodiment of the present disclosure, the electrical signals provided from the first internal channel Ich1 may be directly provided to the first master external circuit block 151 without electrically passing through the first master internal circuit block 161. The first master internal circuit block 161 may be electrically connected to master memory cells and master memory core circuits in the master cell bank area CBm through the internal interconnections. For example, the first master internal circuit block 161 may be electrically connected to bit lines and sense amplifiers in the master memory cells and the master memory core circuits through the internal interconnections. The first master internal circuit block 161 may transfer the electrical signals provided from the first master external circuit block 151 to the master cell bank area CBm. The first master internal circuit block 161 may transfer the electrical signals provided from the master cell bank area CBm to the first master external circuit block 151.

Accordingly, the first master external pads 111P may communicate with the master cell bank area CBm through the first master external circuit block 151 and the first master internal circuit block 161. The first master external pads 111P, the first master external circuit block 151, the first master internal circuit block 161, and the bit line or the sense amplifier of the master cell bank area CBm may be serially connected.

The second master external circuit block 152 may be disposed adjacent to the second master external pads 112P in the second master external pad region 112R. The second master external circuit block 152 may be electrically connected to the second master external pads 112P in the second master external pad region 112R and communicate with the memory controller 900 through the second external channel Ech2. The second master external circuit block 152 may be electrically connected to and communicate with the second master internal circuit block 162 through the internal interconnections. For example, the second master external circuit block 152 may receive a clock signal, a chip selection signal, a command signal, and an address signal through the second external channel Ech2 and transfer them to the second master internal circuit block 162. The second master external circuit block 152 may transfer the electrical signals received from the second master internal circuit block 162 to the second external channel Ech2.

The second master internal circuit block 162 may be disposed adjacent to the second master internal pads 122P in the second master internal pad region 122R. The second master internal circuit block 162 may be electrically connected to the second master internal pads 122P in the second master internal pad region 122R and communicate with the slave memory chips 200 to 400 through the second internal channel Ich2. The second master internal circuit block 162 may transfer the electrical signals received from the second master external circuit block 152 to the second internal channel Ich2. The second master internal circuit block 162 may transfer the electrical signals received from the second internal channel Ich2 to the second master external circuit block 152. According to an embodiment of the present disclosure, the electrical signals provided from the second master external circuit block 152 may be directly provided to the second internal channel Ich2 without electrically passing through the second master internal circuit block 162. The second master internal circuit block 162 may transfer the electrical signals received from the second internal channel Ich2 to the second master external circuit block 152. According to an embodiment of the present disclosure, the electrical signals provided from the second internal channel Ich2 may be provided to the second master external circuit block 152 without electrically passing through the second master internal circuit block 162. The second master internal circuit block 162 may be electrically connected to the master memory cells and the master memory core circuits in the master cell bank area CBm through the internal interconnections. For example, the second master internal circuit block 162 may be electrically connected to word lines in the master memory cells and the master memory core circuits through the internal interconnections. The second master internal circuit block 162 may transfer the electrical signals provided from the second master external circuit block 152 to the master cell bank area CBm. The second master internal circuit block 162 may transfer the electrical signals provided from the master cell bank area CBm to the second master external circuit block 152.

Accordingly, the second master external pads 112P may communicate with the master cell bank area CBm through the second master external circuit block 152 and the second master internal circuit block 162. The second master external pads 112P, the second master external circuit block 152, the second master internal circuit block 162, and the word line of the master cell bank area CBm may be connected in series.

Figure 5A:
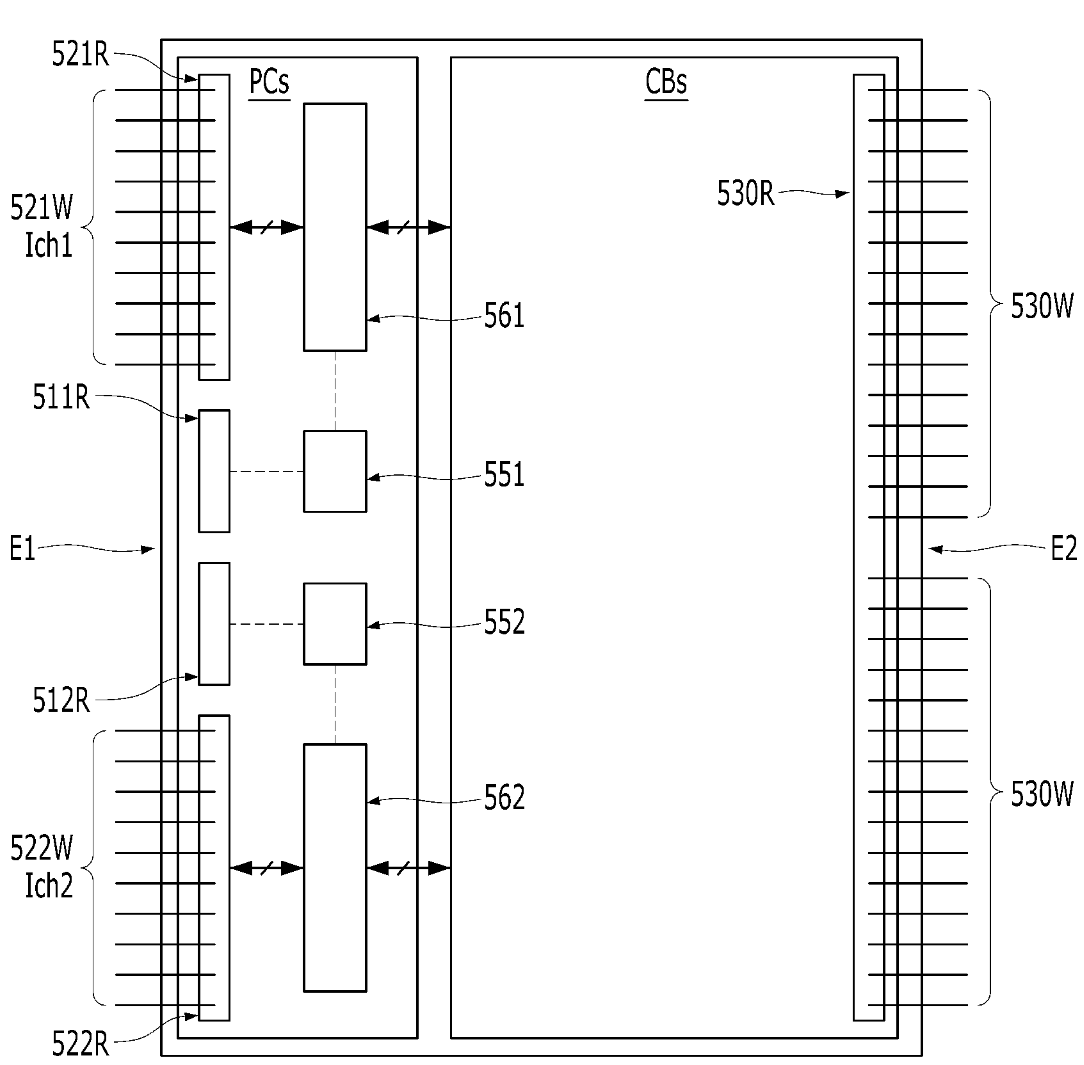
FIGS. 5A and 5B are views illustrating an arrangement of internal circuit blocks and internal electrical signal paths of a slave memory chip in accordance with an embodiment of the present disclosure.
Figure 5B:
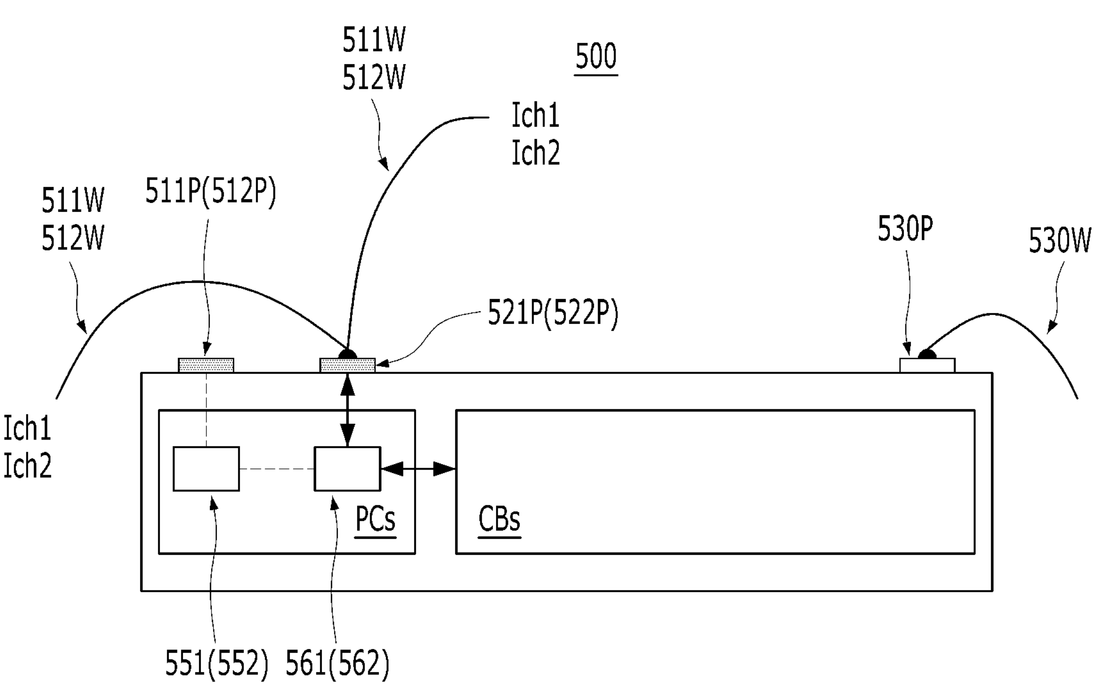

FIGS. 5A and 5B illustrate an arrangement of internal circuit blocks and internal electrical signal paths of a slave memory chip 500 in accordance with an embodiment of the present disclosure. Double-headed arrows indicate electrical connection and communication paths of elements, and dotted lines indicate that the components are electrically connected but not in communication. The slave memory chip 500 may be one of the lower, intermediate, and upper slave memory chips 200 to 400. Referring to FIGS. 5A and 5B, the slave memory chip 500 may include a slave cell bank area CBs and a slave peripheral circuit area PCs. The slave peripheral circuit area PCs may be disposed adjacent to the first side edge E1. The slave cell bank areas CBs may be disposed adjacent to the second side edge E2. According to an embodiment of the present disclosure, the slave peripheral circuit area PCs may overlap with or be adjacent to the slave pad regions 511R, 512R, 521R, and 522R. The slave cell bank areas CBs may overlap with or be adjacent to the power pad regions (refer to 230R, 330R, and 430R of FIGS. 2B to 2D). The slave cell bank areas CBs may include slave memory cell blocks and slave core blocks. The slave peripheral circuit area PCs may include a first slave external circuit block 551, a second slave external circuit block 552, a first slave internal circuit block 561, and a second slave internal circuit block 562. The first slave external circuit block 551 may include a slave data buffer. The second slave external circuit block 552 may include a slave signal buffer. The first slave internal circuit block 561 may include a slave data serializing/de-serializing circuit. The second slave internal circuit block 562 may include a slave signal decoding circuit.

The first slave data buffer 551 may be disposed adjacent to the first slave external pads 511P in the first slave external pad region 511R. The first slave external circuit block 551 may be electrically connected to the first slave external pads 511P in the first slave external pad region 511R. However, the first slave external circuit block 551 might not be connected to the first external channel Ech1 and might not communicate with the memory controller 900. The first slave external circuit block 551 may be electrically connected to the first slave internal circuit block 561 through the internal interconnections. However, the first slave external circuit block 551 might not communicate with the first slave internal circuit block 561. For example, the first slave external circuit block 551 may be a dummy.

The first slave internal circuit block 561 may be disposed adjacent to the first slave internal pads 521P. The first slave internal circuit block 561 may be electrically connected to the first slave internal pads 521P in the first slave internal pad regions 521R through the internal interconnections. Accordingly, the first slave internal circuit block 561 may receive a data signal and a data strobe signal from the first master external circuit block 151 of the master memory chip 100 through the first internal channel Ich1 and the first slave internal pads 521P. The first slave internal circuit block 561 may be electrically connected to slave memory cells and slave memory core circuits in the slave cell bank area CBs through the internal interconnections. The first slave internal circuit block 561 may transfer the electrical signal received from the first internal channel Ich1 to the slave cell bank area CBS and transfer the electrical signals received from the slave cell bank area CBS to the first internal channel Ich1.

Accordingly, the first master external pads 111P may communicate with the slave cell bank area CBs through the first master external circuit block 151 and the first slave internal circuit block 561. The first master external pads 111P, the first master external circuit block 151, the first slave internal circuit block 561, and the bit line or sense amplifier of the slave cell bank area CBs may be connected in series.

The second slave external circuit block 552 may be disposed adjacent to the second slave external pads 512P in the second slave external pad region 512R. The second slave external circuit block 552 may be electrically connected to the second slave external pads 512P in the second slave external pad region 512R. However, the second slave external circuit block 552 might not be connected to the second external channel Ech2 and might not communicate with the memory controller 900. The second slave external circuit block 552 may be electrically connected to the second slave internal circuit block 562 through the internal interconnections. However, the second slave external circuit block 552 might not communicate with the second slave internal circuit block 562. For example, the second slave external circuit block 552 may be a dummy.

The second slave internal circuit block 562 may be disposed adjacent to the second slave internal pads 522P. The second slave internal circuit block 562 may be electrically connected to the second slave internal pads 522P in the second slave internal pad regions 522R through the internal interconnections. Accordingly, the second slave internal circuit block 562 may receive a clock signal, a chip selection signal, a command signal, and an address signal from the second master external circuit block 152 of the master memory chip 100 through the second internal channel Ich2 and the second slave internal pads 522P. The second slave internal circuit block 562 may be electrically connected to the slave memory cells and the slave memory core circuits in the slave cell bank area CBs through the internal interconnections. The second slave internal circuit block 562 may transfer the electrical signal received from the second internal channel Ich2 to the slave cell bank area CBs, and transfer the electrical signal received from the slave cell bank area CBs to the second internal channel Ich2.

Accordingly, the second master external pads 112P may communicate with the slave cell bank area CBs through the second master external circuit block 152 and the second slave internal circuit block 562. The second master external pads 112P, the second master external circuit block 152, the second slave internal circuit block 562, and the word line of the slave cell bank area CBs may be connected in series. According to the inventive concept of the present disclosure, the first master external circuit block 151 of the master memory chip 100 may control the first master internal circuit block 161 and the first slave internal circuit block 561. For example, the first master external circuit block 151 of the master memory chip 100 may transfer the data signal and the data strobe signal to the first master internal circuit block 161 and the first slave internal circuit block 561, and receive the data signal from the first master internal circuit block 161 and the first slave internal circuit block 561. The first slave external circuit block 551 of the slave memory chip 500 may be passed.

According to the inventive concept of the present disclosure, the second master external circuit block 152 of the master memory chip 100 may control the second master internal circuit block 162 and the second slave internal circuit block 562. For example, the second master external circuit block 152 of the master memory chip 100 may provide the second master internal circuit block 162 and the second slave internal circuit block 562 with the clock signal, the chip selection signal, the command signal, and the address signal. The second slave external circuit block 552 may be passed or skipped.

Figure 6:
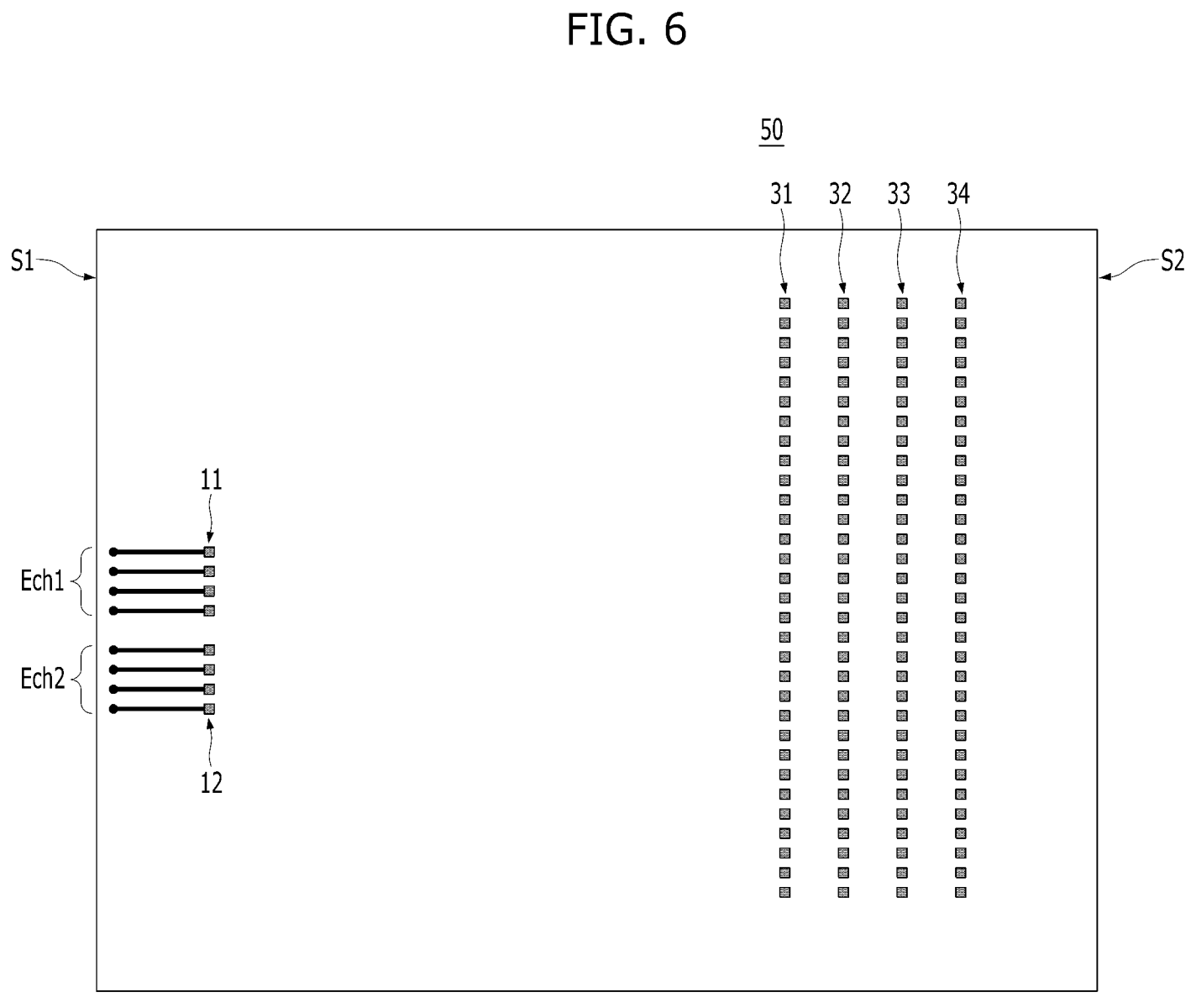

FIG. 6 is a schematic top view illustrating the substrate 50 in accordance with the embodiment of the present disclosure. Referring to FIG. 6, the substrate 50 may include the first and second external channels Ech1 and Ech2, and the first and second signal bond fingers 11 and 12 disposed on the upper surface. The first and second external channels Ech1 and Ech2, and the first and second signal bond fingers 11 and 12 may be disposed in a left half portion of the substrate 50 to be adjacent to a first side S1 of the substrate 50. The first to fourth power bond fingers 31 to 34 may be disposed in a right half portion of the substrate 50 to be close to a second side S2 of the substrate 50. The first to fourth power bond fingers 31 to 34 may be disposed to form columns, respectively. The columns may extend parallel to the second side S2 of the substrate 50. The first power bond fingers 31 may be disposed farthest from the second side S2 of the substrate 50. The fourth power bond fingers 34 may be disposed closest to the second side S2 of the substrate 50. Referring further to FIG. 3A, in the top view, the first power bond finger 31 may be disposed at a position that is covered by at least one among the lower, intermediate, and upper slave memory chips 200 to 400. The second power bond finger 32 may be disposed at a position that is covered by at least one among the intermediate and upper slave memory chips 300 and 400. The third power bond finger 33 may be disposed at a position that is covered by the upper slave memory chip 400. The fourth power bond finger 34 may be exposed without being covered by the memory chips 100 to 400. The drawing illustrates that only the first to fourth power bond fingers 31 to 34 form four columns, but since the memory chips may be stacked in two or more layers according to the inventive concepts of the present disclosure, the power bond fingers may be disposed to form two or more columns.

Figure 7A:
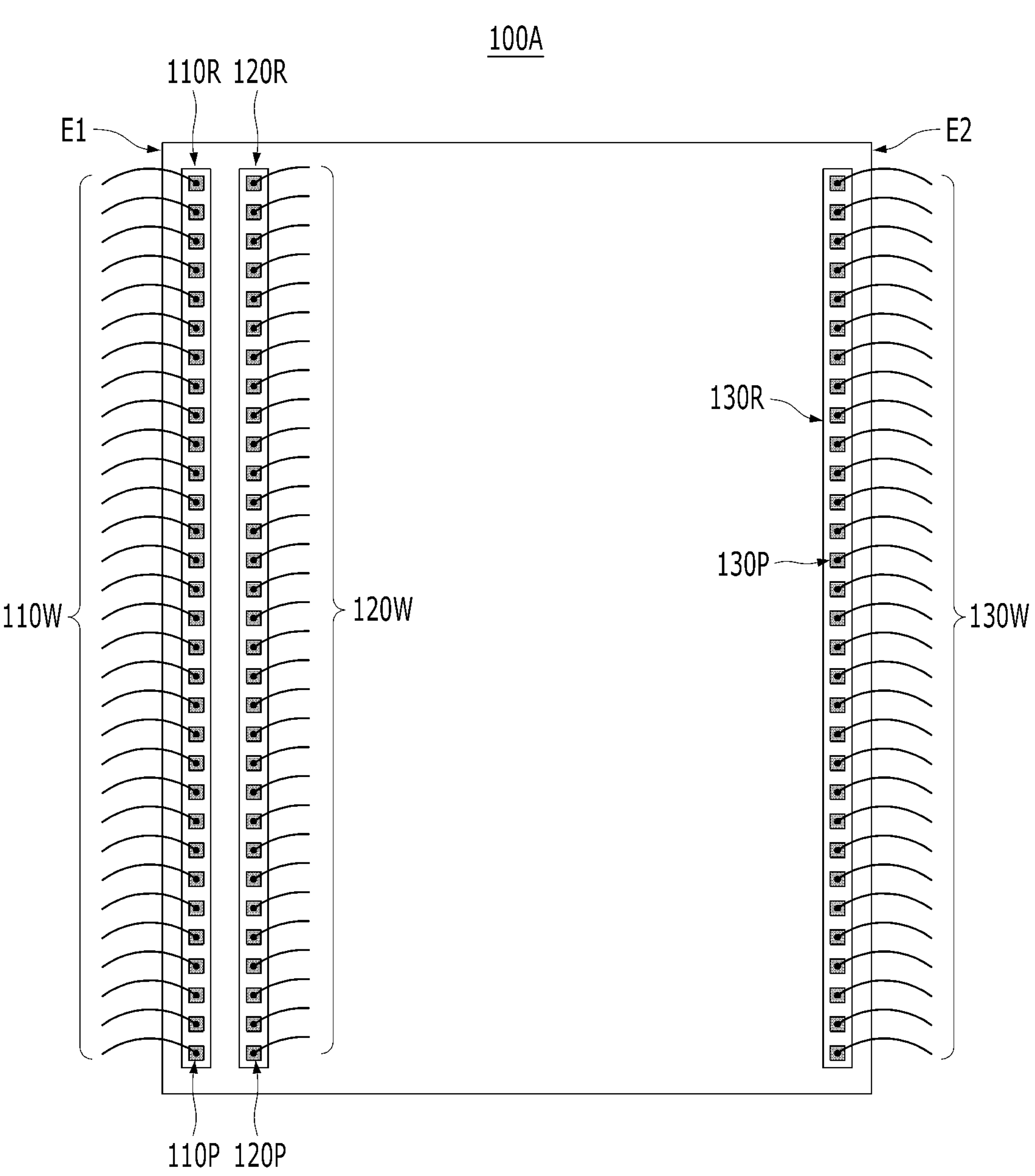
FIG. 7A is a top view illustrating a master memory chip in accordance with an embodiment of the present disclosure.

FIG. 7A is a top view illustrating a master memory chip 100A in accordance with another embodiment of the present disclosure. Referring to FIG. 7A, the master memory chip 100A according to the embodiment of the present disclosure may include a master external pad region 110R, a master internal pad region 120R, and a master power pad region 130R. The master external pad region 110R and the master internal pad region 120R may be disposed to be adjacent to the first side edge E1 of the master memory chip 100A and to form two columns. For example, the master external pad region 110R may be disposed closer to the first side edge E1 to form one column of the master memory chip 100A. The master internal pad region 120R may be disposed adjacent to the external pad region 110R to form one column. The master power pad region 130R may be disposed adjacent to the second side edge E2 of the master memory chip 100A to form one column. The master external pads 110P may be disposed in the master external pad region 110R. The master external pads 110P may include first and second master external pads 111P and 112P shown in FIG. 2A. The master external pads 110P may be electrically connected to the external bonding wires 110W. The master internal pads 120P may be disposed in the master internal pad region 120R. The master internal pads 120P may include first and second master internal pads 121P and 122P shown in FIG. 2A. The master internal pads 120P may be electrically connected to the lower internal bonding wires 120W.

Figure 7B:
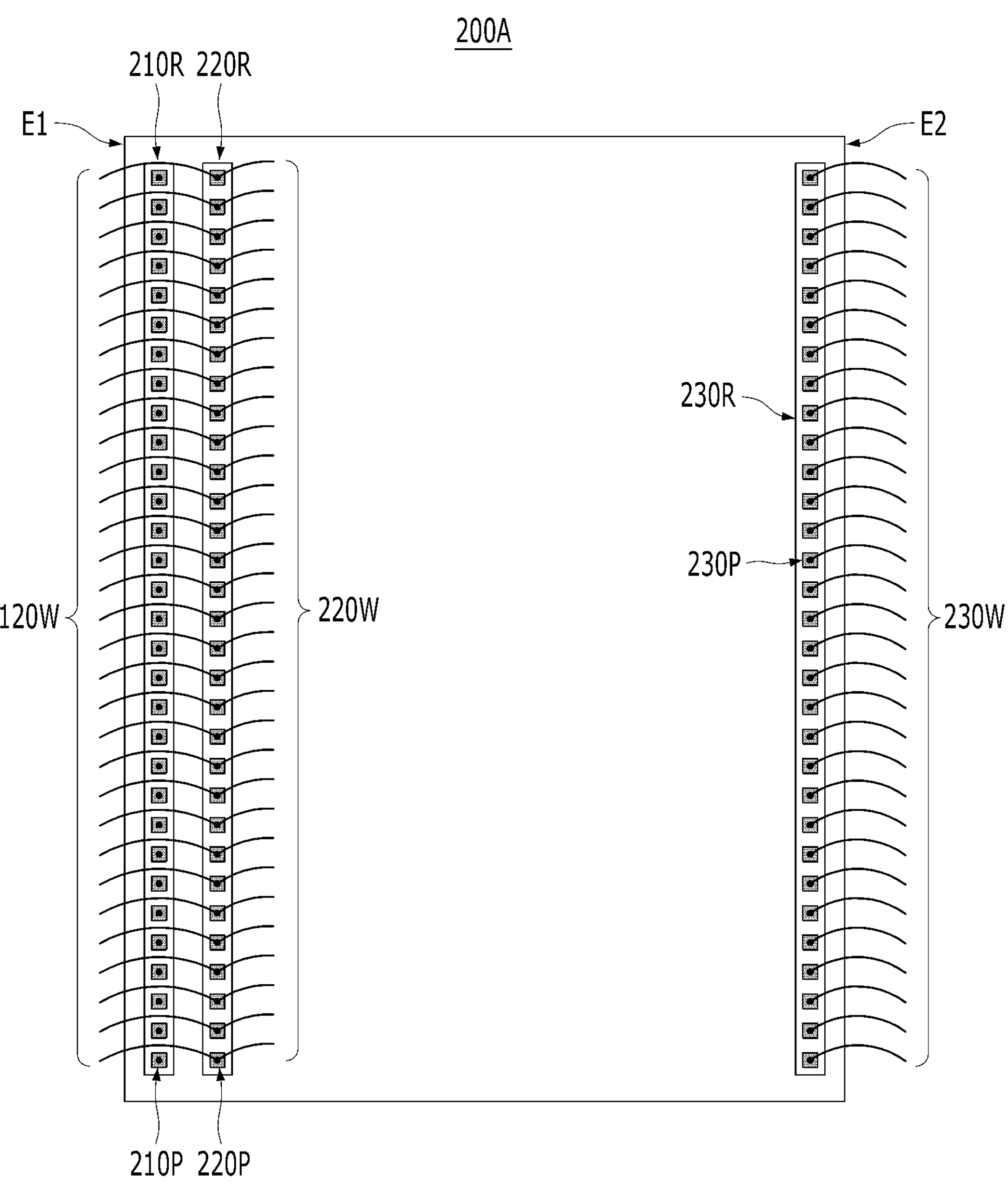
FIGS. 7B to 7D are top views illustrating a lower slave memory chip, an intermediate slave memory chip, and an upper slave memory chip in accordance with embodiments of the present disclosure.
Figure 7C:
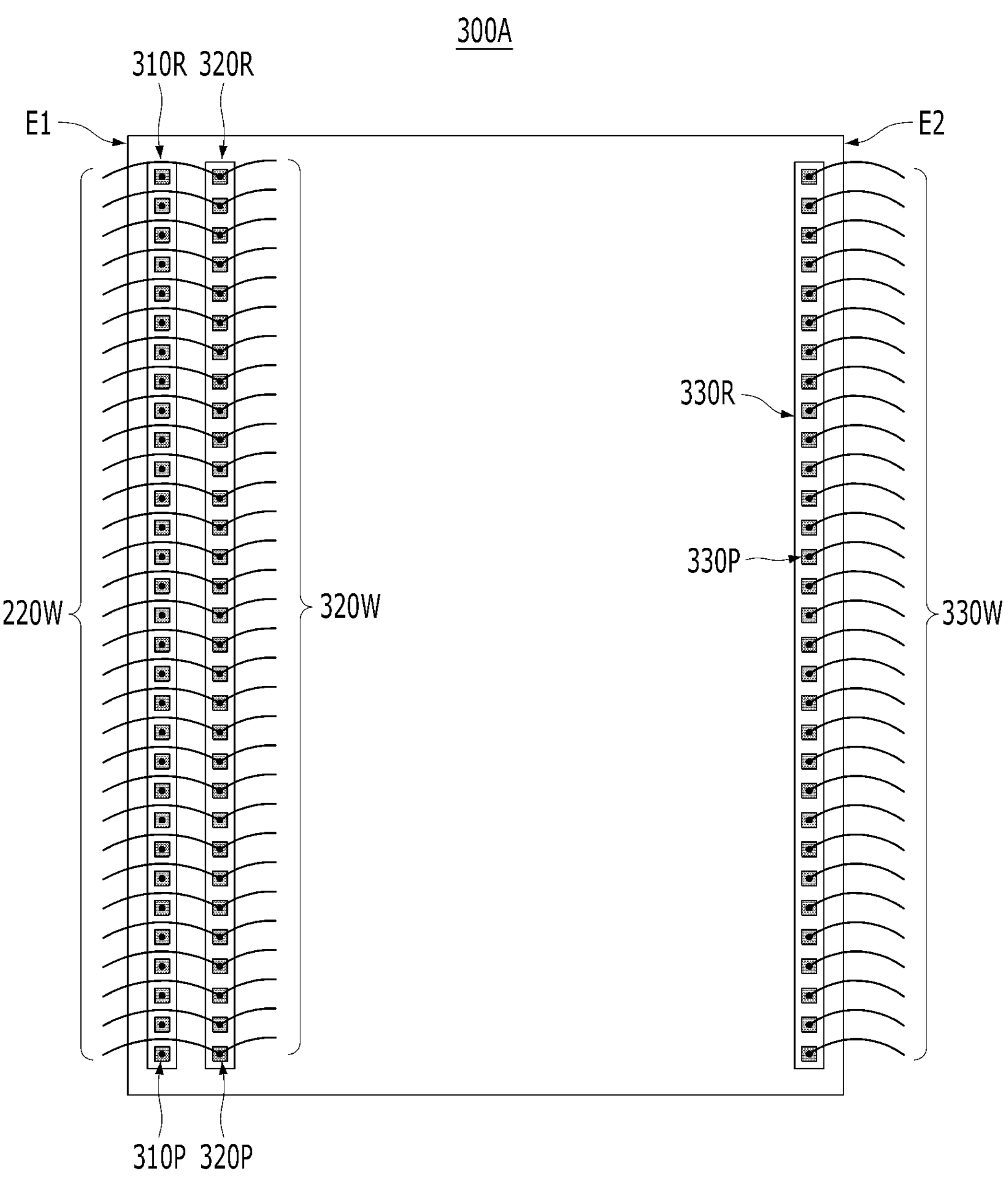
Figure 7D:
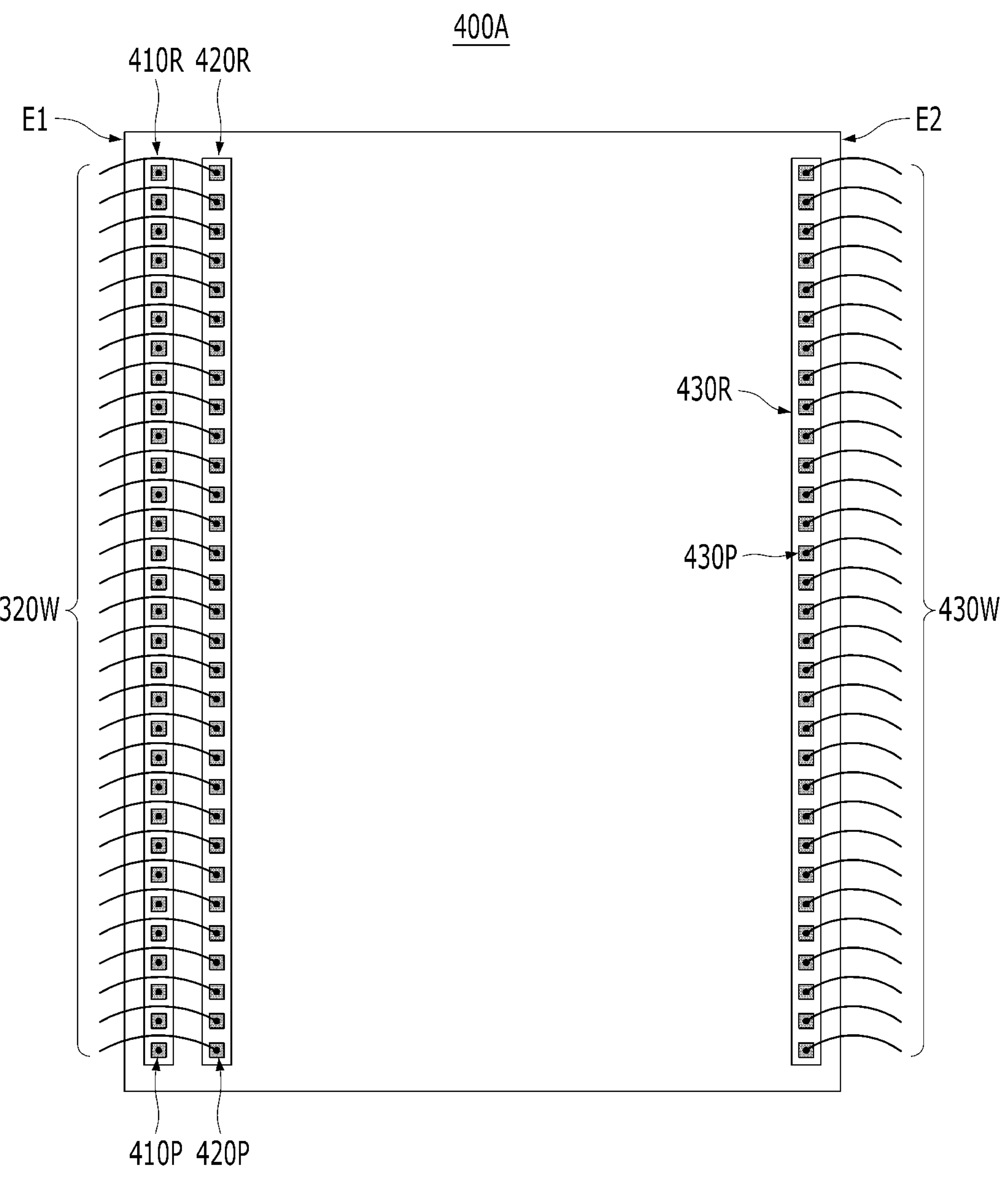

FIGS. 7B to 7D are top views illustrating a lower slave memory chip 200A, an intermediate slave memory chip 300A, and an upper slave memory chip 400A in accordance with embodiments of the present disclosure. Referring to FIGS. 7B to 7D, the slave memory chips 200A, 300A, and 400A may include slave external pad regions 210R, 310R, and 410R, and slave internal pad regions 220R, 320R, and 420R, and the slave power pad regions 230R, 330R, and 430R, respectively. The slave external pad regions 210R, 310R, and 410R, and the slave internal pad regions 220R, 320R, and 420R may be disposed adjacent to the first side edges E1 of the slave memory chips 200A, 300A, and 400A, and form two columns. For example, the slave external pad regions 210R, 310R, and 410R may be disposed to form one column to be closer to the first side edges E1 of the slave memory chips 200A, 300A, and 400A. The slave internal pad regions 220R, 320R, and 420R may be disposed to form one column to be adjacent to the slave external pad regions 210R, 310R, and 410R, respectively. For example, the slave external pad regions 210R, 310R, and 410R may be disposed between the first side edge E1 and the respective slave internal pad regions 220R, 320R, and 420R. The slave power pad regions 230R, 330R, and 430R may be disposed to form one column to be adjacent to the second side edges E2 of the respective slave memory chips 200A, 300A, and 400A.

The slave external pads 210P, 310P, and 410P may be disposed in the slave external pad regions 210R, 310R, and 410R, respectively. The slave external pads 210P, 310P, and 410P may respectively include the first external pads 211P, 311P, and 411P and second external pads 212P, 312P, and 412P illustrated in FIGS. 2B to 2D. The slave external pads 210P, 310P, and 410P of the respective slave memory chips 200A, 300A and 400A may have the same arrangement as the master external pads 110P of the master memory chip 100A. The slave internal pads 220P, 320P, and 420P of the respective slave memory chips 200A, 300A, and 400A may have the same arrangement as the master internal pads 120P of the master memory chip 100A. The slave external pads 210P, 310P, and 410P may be floated. That is, the slave external pads 210P, 310P, and 410P might not be bonded and not electrically connected to any bonding wires.

The slave internal pads 220P, 320P, and 420P may be disposed in the slave internal pad regions 220R, 320R, and 420R, respectively. The slave internal pads 220P, 320P, and 420P may respectively include the first slave internal pads 221P, 321P, and 421P and second slave internal pads 222P, 322P, and 422P shown in FIGS. 2B to 2D.

The lower slave internal pads 220P may be electrically connected both to the lower internal bonding wires 120W of the master memory chip 100A and the intermediate internal bonding wires 220W of the lower slave memory chip 200A.

The intermediate slave internal pads 320P may be electrically connected in common to the intermediate internal bonding wires 220W of the lower slave memory chip 200A and the upper internal bonding wires 320W of the intermediate slave memory chip 300A.

The upper slave internal pads 420P may be electrically connected to the upper internal bonding wires 320W of the intermediate slave memory chip 300A.

The lower internal bonding wires 120W of the master memory chip 100A, the intermediate internal bonding wires 220W of the lower slave memory chip 200A, and the upper internal bonding wires 320W of the intermediate slave memory chip 300A may form an internal channel.

Figure 8A:
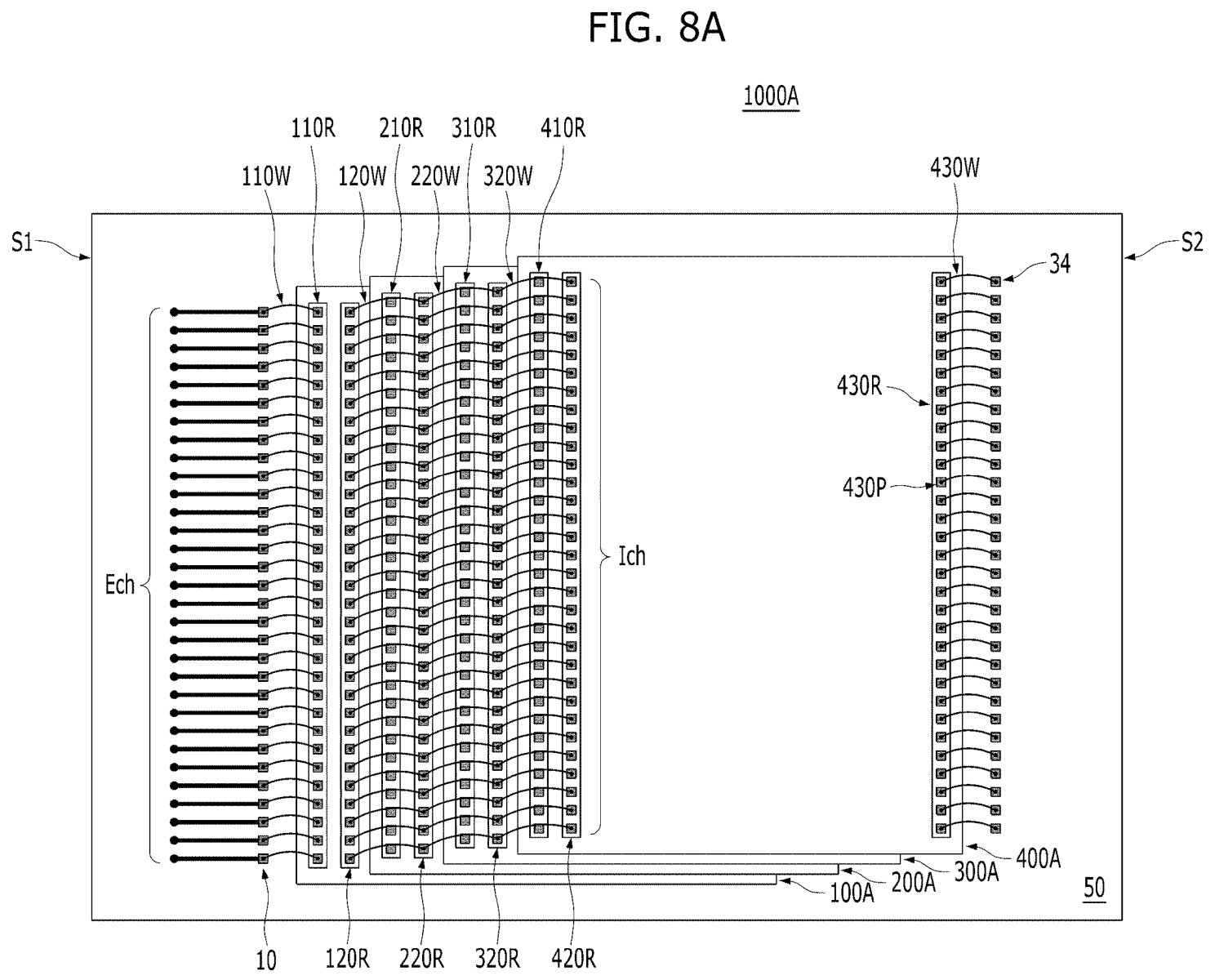
Figure 8B:
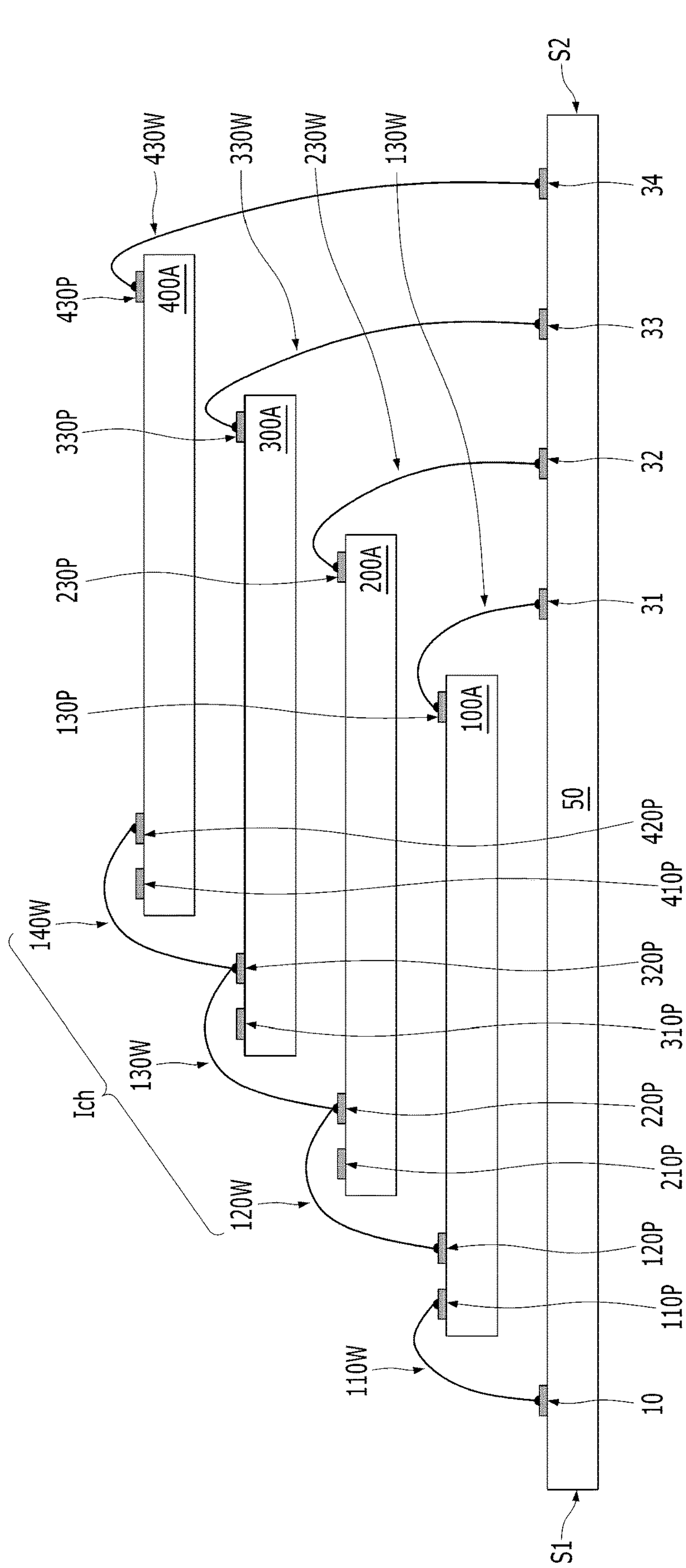

FIGS. 8A and 8B are top and side views of the semiconductor package 1000A in accordance with another embodiment of the present disclosure. Referring to FIGS. 8A and 8B, the semiconductor package 1000A may include the master memory chip 100A, the lower slave memory chip 200A, the intermediate slave memory chip 300A, and the upper slave memory chip 400A that are offset stacked over the substrate 50. The substrate 50 may include external channels Ech, signal bond fingers 10, and first to fourth power bond fingers 31 to 34.

Referring to FIGS. 7A, 8A, 8B, the master external pads 110P of the master memory chip 100A may be connected to the signal bond fingers 10 over the substrate 50 through the external bonding wires 110W. The signal bond fingers 10 may be connected to the external channels Ech in the substrate 50.

Referring to FIGS. 7B to 7D, 8A and 8B, the slave external pads 210P, 310P, and 410P of the slave memory chips 200A to 400A may be floated. The slave external pads 210P, 310P, and 410P of the slave memory chips 200A to 400A might not be connected to any bonding wires.

Referring to FIGS. 7A to 7D, 8A, and 8B, the master internal pads 120P of the master memory chip 100A, the lower slave internal pads 220P of the lower slave memory chip 200A, the intermediate slave internal pads 320P of the intermediate slave memory chip 300A, and the upper slave internal pads 420P of the upper slave memory chip 400A may be electrically connected to each other by the internal bonding wires 120W, 220W, and 320W. The internal bonding wires 120W, 220W, and 320W may form internal channels Ich.

The power pads 130P, 230P, 330P, and 430P of the master memory chip 100A, the lower slave memory chip 200A, the intermediate slave memory chip 300A, and the upper slave memory chip 400A may be independently electrically connected to the power bond fingers 31 to 34 of the substrate 50 through the power bonding wires 130W, 230W, 330W, and 430W, respectively.

Figure 9:
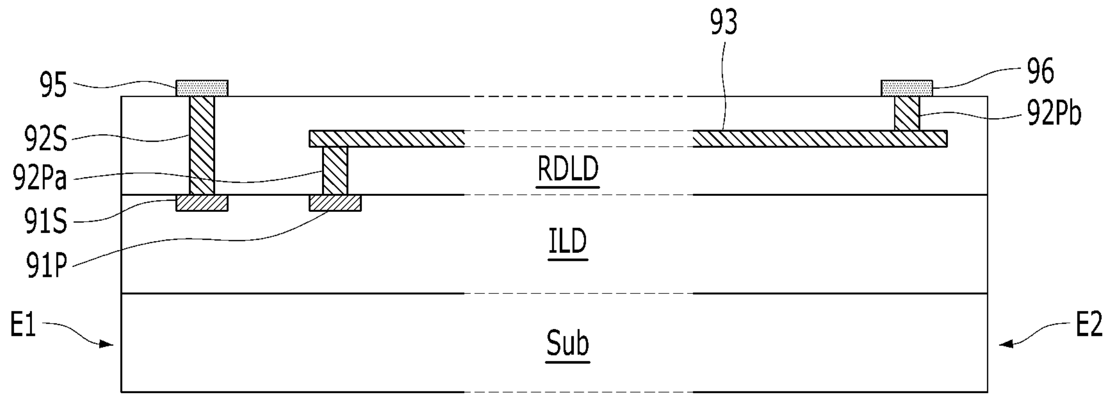
FIG. 9 is a longitudinal cross-sectional view illustrating a redistribution structure of memory chips in accordance with an embodiment of the present disclosure.

FIG. 9 is a longitudinal cross-sectional view illustrating a redistribution structure of memory chips in accordance with an embodiment of the present disclosure. Referring to FIG. 9, the memory chips 100 to 500 may include a semiconductor substrate Sub, an inter-layer dielectric layer ILD, top metal pads 91S and 91P, redistribution vias 92S, 92Pa, and 92Pb, a redistribution wire 93, a redistribution dielectric layer RDLD, and redistribution pads 95 and 96.

The semiconductor substrate Sub may include a silicon wafer. Circuit elements may be formed over the semiconductor substrate Sub. The inter-layer dielectric layer ILD may cover the circuit elements. The inter-layer dielectric layer ILD may include silicon oxide-based dielectric layers and silicon nitride-based dielectric layers.

The top metal pads 91S and 91P may be formed over the inter-layer dielectric layer ILD. The top metal pads 91S and 91P may include a signal top metal pad 91S and a power top metal pad 91P. The signal top metal pad 91S and the power top metal pad 91P may include a metal, such as aluminum (Al). Both the signal top metal pad 91S and the power top metal pad 91P may be disposed adjacent to the first side edge E1 of the semiconductor substrate Sub.

The redistribution pads 95 and 96 may be disposed over the redistribution dielectric layer RDLD. The redistribution pads 95 and 96 may include a signal redistribution pad 95 and a power redistribution pad 96. The signal redistribution pad 95 may be formed adjacent to the first side edge E1 of the semiconductor substrate Sub, and the power redistribution pad 96 may be formed adjacent to the second side edge E2 of the semiconductor substrate Sub. The first side edge E1 of the semiconductor substrate Sub may correspond to the first side edges E1 of the master memory chip 100 and the slave memory chips 200 to 400, and the second side edge E2 of the semiconductor substrate Sub may correspond to the second side edges E2 of the master memory chip 100 and the slave memory chips 200 to 400.

The signal redistribution via 92S may vertically penetrate the redistribution dielectric layer RDLD to electrically connect the signal top metal pad 91S and the signal redistribution pad 95.

The lower power redistribution via 92Pa may be disposed over the power top metal pad 91P, and the upper power redistribution via 92Pb may be disposed below the power redistribution pad 96. The lower power redistribution via 92Pa and the upper power redistribution via 92Pb may vertically penetrate a portion of the redistribution dielectric layer RDLD.

The redistribution wire 93 may electrically connect the lower power redistribution via 92Pa and the upper power redistribution via 92Pb. The redistribution wire 93 may horizontally extend within the redistribution dielectric layer RDLD.

According to the technical concept of the present disclosure, the power top metal pad 91P disposed adjacent to the first side edge E1 and the power redistribution pad 96 disposed adjacent to the second side edge E2 may be electrically connected to each other through the lower power redistribution via 92Pa, the redistribution wire 93, and the upper power redistribution via 92Pb. Accordingly, the power provided to the power redistribution pad 96 which is close to the second edge E2 may be transferred and provided to the power top metal pad 91P disposed adjacent to the first side edge E1. According to the technical concept of the present disclosure, the peripheral circuit areas PCm and PCs may be disposed close to the first side edge E1, but may be supplied with power through the power pads 130P to 530P that are disposed close to the second side edge E2.

According to the embodiment of the present disclosure, it is possible to provide a three-dimensionally stacked (3DS) memory device having an electrical connection structure formed using a relatively inexpensive wire bonding structure instead of using expensive through-silicon vias (TSVs).

According to the embodiment of the present disclosure, pads, and bonding wires may be separately disposed according to functions and channels. Accordingly, it is possible to simplify interconnection routings, reduce parasitic capacitance between interconnections, reduce signal loss, and suppress signal interference and noise generation.

While the present disclosure has been described with respect to the specific embodiments, it will be apparent to those skilled in the art that various changes and modifications may be made without departing from the spirit and scope of the disclosure as defined in the following claims. Furthermore, the embodiments may be combined to form additional embodiments.

What is claimed is:

1. A semiconductor package, comprising:

a substrate having a plurality of bond fingers;

a master memory chip mounted over the substrate; and a slave memory chip stacked over the master memory chip, wherein the master memory chip includes:

master external pads and master internal pads disposed adjacent to a first side edge of the master memory chip; and master power pads disposed adjacent to a second side edge of the master memory chip, and the slave memory chip includes:

slave external pads and slave internal pads disposed adjacent to a first side edge of the slave memory chip; and slave power pads disposed adjacent to a second side edge of the slave memory chip, wherein:

some of the bond fingers are electrically connected to the master external pads through external bonding wires, the master internal pads are electrically connected to the slave internal pads through internal bonding wires, respectively, and the slave external pads are floated.

2. The semiconductor package of claim 1, wherein the bond fingers include:

signal bond fingers disposed adjacent to the first side edge of the master memory chip; and master power bond fingers and slave power bond fingers disposed adjacent to the second side edge of the master memory chip.

3. The semiconductor package of claim 2, wherein the signal bond fingers and the master internal pads are not electrically connected with each other.

4. The semiconductor package of claim 2, wherein:

the master power bond fingers are connected to the master power pads through master power bonding wires, respectively, and the slave power bond fingers are connected to the slave power pads through slave power bonding wires, respectively.

5. The semiconductor package of claim 2, wherein:

the master external pads include a first master external pad and a second master external pad disposed adjacent to a middle portion of the first side edge of the master memory chip, the master internal pads include a first master internal pad and a second master internal pad separately disposed adjacent to both ends of the first side edge of the master memory chip, respectively, the slave external pads include a first slave external pad and a second slave external pad disposed adjacent to a middle portion of the first side edge of the slave memory chip, and the slave internal pads include a first slave internal pad and a second slave internal pad separately disposed adjacent to both ends of the first side edge of the slave memory chip, respectively.

6. The semiconductor package of claim 5, wherein:

the signal bond fingers include a first signal bond finger and a second signal bond finger, the first signal bond finger is disposed on the substrate adjacent to the first master external pad, and the second signal bond finger is disposed on the substrate adjacent to the second master external pad.

7. The semiconductor package of claim 6, wherein:

the external bonding wires include:

a first external bonding wire connecting the first signal bond finger to the first master external pad; and a second external bonding wire connecting the second signal bond finger to the second master external pad, and the internal bonding wires include:

a first internal bonding wire connecting the first master internal pad to the first slave internal pad; and a second internal bonding wire connecting the second master internal pad to the second slave internal pad, and the first slave external pad and the second slave external pad are not connected to any bonding wires.

8. The semiconductor package of claim 6, wherein the master memory chip includes a master cell bank and a master peripheral circuit, and wherein the master peripheral circuit includes:

a first master external circuit block adjacent to and electrically connected to the first master external pad;

a first master internal circuit block adjacent to and electrically connected to the first master internal pad;

a second master external circuit block adjacent to and electrically connected to the second master external pad; and a second master internal circuit block adjacent to and electrically connected to the second master internal pad.

9. The semiconductor package of claim 8, wherein:

the first master external circuit block includes a master data buffer, the first master internal circuit block includes a master data serializing/de-serializing circuit, the second master external circuit block includes a master signal buffer, and the second master internal circuit block includes a master signal decoding circuit.

10. The semiconductor package of claim 9, wherein:

the first master external circuit block and the first master internal circuit block transfer data signals and a data strobe signal, and the second master external circuit block and the second master internal circuit block transfer a clock signal, a chip selection signal, a command signal, and an address signal.

11. The semiconductor package of claim 8, wherein:

the first master external circuit block and the first master internal circuit block are disposed adjacent to and electrically connected to each other; and the second master external circuit block and the second master internal circuit block are disposed adjacent to and electrically connected to each other.

12. The semiconductor package of claim 11, wherein:

the first master external circuit block, the first master internal circuit block, and a bit line of the master cell bank are serially connected, and the second master external circuit block, the second master internal circuit block, and a word line of the master cell bank are serially connected.

13. The semiconductor package of claim 8, wherein the slave memory chip includes a slave cell bank and a slave peripheral circuit, and wherein the slave peripheral circuit includes:

a first slave external circuit block adjacent to and electrically connected to the first slave external pad;

a first slave internal circuit block adjacent to and electrically connected to the first slave internal pad;

a second slave external circuit block adjacent to and electrically connected to the second slave external pad; and a second slave internal circuit block adjacent to and electrically connected to the second slave internal pad.

14. The semiconductor package of claim 13, wherein:

the first master external circuit block, the first slave internal circuit block, and a bit line of the slave cell bank are serially connected, and the second master external circuit block, the second slave internal circuit block, and a word line of the slave cell bank are serially connected.

15. A semiconductor package, comprising:

a substrate including signal bond fingers disposed adjacent to a first side, and first power bond fingers and second power bond fingers disposed adjacent to a second side;

a master memory chip stacked over the substrate; and a lower slave memory chip stacked over the master memory chip, wherein the master memory chip includes:

master external pads;

master internal pads; and master power pads electrically connected to the first power bond fingers, wherein the lower slave memory chip includes:

lower slave external pads;

lower slave internal pads; and lower slave power pads electrically connected to the second power bond fingers, wherein:

the master external pads and the master internal pads are disposed adjacent to a first side edge of the master memory chip in a side-by-side, the lower slave external pads and the lower slave internal pads are disposed adjacent to a first side edge of the lower slave memory chip in a side-by-side, the signal bond fingers are electrically connected to the master external pads through external bonding wires, respectively, the master internal pads are electrically connected to the lower slave internal pads through lower internal bonding wires, respectively, and the master external pads and the lower slave external pads are not connected through the bonding wires.

16. The semiconductor package of claim 15, wherein:

the signal bond fingers include a first signal bond finger and a second signal bond finger, the master external pads include a first master external pad and a second master external pad, the master internal pads include a first master internal pad and a second master internal pad, the lower slave external pads include a first lower slave external pad and a second lower slave external pad, the lower slave internal pads include a first lower slave internal pad and a second lower slave internal pad, the external bonding wires include a first external bonding wire and a second external bonding wire, the lower internal bonding wires include a first lower internal bonding wire and a second lower internal bonding wire, the first signal bond finger, the first external bonding wire, the first master external pad, the first master internal pad, the first lower internal bonding wire, and the first lower slave internal pad are electrically connected to form a first channel, and the second signal bond finger, the second external bonding wire, the second master external pad, the second master internal pad, the second lower internal bonding wire, and the second lower slave internal pad are electrically connected to form a second channel.

17. The semiconductor package of claim 16, wherein the master memory chip includes:

a first master external circuit block electrically connected to the first master external pad;

a second master external circuit block electrically connected to the second master external pad;

a first master internal circuit block electrically connected to the first master internal pad; and a second master internal circuit block electrically connected to the second master internal pad, wherein:

the first master external circuit block and the first master internal circuit block are electrically connected, and the second master external circuit block and the second master internal circuit block are electrically connected, wherein the lower slave memory chip includes:

a first lower slave external circuit block electrically connected to the first lower slave external pad;

a second lower slave external circuit block electrically connected to the second lower slave external pad;

a first lower slave internal circuit block electrically connected to the first lower slave internal pad; and a second lower slave internal circuit block electrically connected to the second lower slave internal pad, wherein the first lower slave external circuit block and the first lower slave internal circuit block are electrically connected, and wherein the second lower slave external circuit block and the second lower slave internal circuit block are electrically connected.

18. The semiconductor package of claim 15, further comprising:

an upper slave memory chip stacked over the lower slave memory chip, wherein the upper slave memory chip includes:

upper slave external pads;

upper slave internal pads; and upper slave power pads, wherein:

the upper slave external pads and the upper slave internal pads are disposed adjacent to a first side edge of the upper slave memory chip in a side-by-side, the lower slave internal pads are electrically connected to the upper slave internal pads through upper internal bonding wires, respectively, wherein the master external pads and the master internal pads are not electrically connected to the lower slave external pads through bonding wires, and the master external pads, the master internal pads, the lower slave external pads, and the lower slave internal pads are not connected to the upper slave external pads through bonding wires.

19. The semiconductor package of claim 15, wherein:

the master external pads are electrically connected to the master internal pads through internal interconnections in the master memory chip, and the lower slave external pads are electrically connected to the lower slave internal pads through internal interconnections in the lower slave memory chip.

20. A semiconductor package comprising:

a substrate having a bond finger;

a master memory chip mounted over the substrate, the master memory chip including a master external pad and a master internal pad;

a first slave memory chip stacked over the master memory chip, the first slave memory chip including a first slave external pad and a first slave internal pad; and a second slave memory chip stacked over the first slave memory chip, the second slave memory chip including a second slave external pad and a second slave internal pad wherein:

the bond finger is electrically connected to the master external pad through an external bonding wire, the master internal pad is electrically connected to the first slave internal pad through first internal bonding wire, the first slave internal pad are electrically connected to the second slave internal pad through second internal bonding wire, and the first slave external pad and the second slave external pad are floating.

* * * * *